United States Patent [19]
Hashizume et al.

[11] Patent Number: 5,849,446
[45] Date of Patent: Dec. 15, 1998

[54] LIGHT RECEIVING MEMBER HAVING A SURFACE PROTECTIVE LAYER WITH A SPECIFIC OUTERMOST SURFACE AND PROCESS FOR THE PRODUCTION THEREOF

[75] Inventors: Junichiro Hashizume; Shigenori Ueda, both of Nara; Makoto Aoki, Tsuzuki-gun, all of Japan

[73] Assignee: Canon Kabushiki Kaisha, Tokyo, Japan

[21] Appl. No.: 785,862

[22] Filed: Jan. 21, 1997

[30] Foreign Application Priority Data

Jan. 19, 1996 [JP] Japan ..................................... 8-024845

[51] Int. Cl.⁶ .................................................... G03G 5/082
[52] U.S. Cl. ............................. 430/67; 430/128; 430/133
[58] Field of Search ................................ 430/128, 67, 133

[56] References Cited

U.S. PATENT DOCUMENTS

| | | | |
|---|---|---|---|
| 4,664,999 | 5/1987 | Kakinuma et al. | 430/67 |
| 4,675,265 | 6/1987 | Kazama et al. | 430/67 |
| 5,392,098 | 2/1995 | Ehara et al. | 355/219 |
| 5,582,944 | 12/1996 | Yamamura et al. | 430/66 |
| 5,582,947 | 12/1996 | Shirai et al. | 430/128 |
| 5,647,953 | 7/1997 | Williams et al. | 156/643.1 |

FOREIGN PATENT DOCUMENTS

| | | | |
|---|---|---|---|
| 0154160 | 9/1985 | European Pat. Off. | C23C 14/28 |
| 54-43037 | 4/1979 | Japan | G03G 15/08 |
| 57-115551 | 7/1982 | Japan | G03G 5/04 |
| 58-144865 | 8/1983 | Japan | G03G 5/04 |
| 60-7451 | 1/1985 | Japan | G03G 5/08 |
| 6-317920 | 11/1994 | Japan | G03G 5/08 |

*Primary Examiner*—John Goodrow
*Attorney, Agent, or Firm*—Fitzpatrick, Cella, Harper & Scinto

[57] ABSTRACT

A light receiving member comprising a electrically conductive substrate, a photoconductive layer composed of a non-single crystalline material containing at least silicon atoms as a matrix formed on said substrate by decomposing a silicon-containing raw material gas, and a surface protective layer composed of a non-single crystalline carbon material containing hydrogen formed on said photoconductive layer by decomposing a raw material gas comprising at least a hydrocarbon using a high frequency power with an oscillation frequency of 50 MHz to 450 MHz, wherein a 20 Å or more thick surface side layer region of said surface protective layer composed of said non-single crystalline carbon material is etched at an etching speed of 0.1 to 50 Å/sec. by means of a fluorine-containing plasma produced by decomposing a fluorine-containing gas using a high frequency power with an oscillation frequency of 50 MHz to 450 MHz such that said surface protective layer has a thickness of 100 to 10000 Å and has an etched surface deposited with fluorine atoms so as to cover said etched surface. And a process for producing said light receiving member.

36 Claims, 7 Drawing Sheets

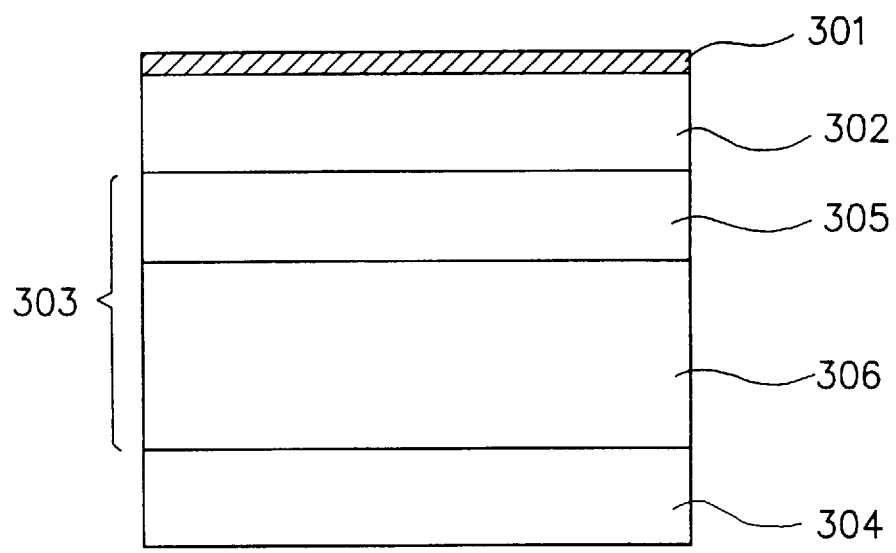
F I G. 3

LIGHT RECEIVING MEMBER HAVING A SURFACE PROTECTIVE LAYER WITH A SPECIFIC OUTERMOST SURFACE AND PROCESS FOR THE PRODUCTION THEREOF

BACKGROUND OF THE INVENTION

1. Field of the Invention

The present invention relates to a light receiving member usable in electrophotography (this light receiving member will be hereinafter referred to as electrophotographic light receiving member or electrophotographic photosensitive member) and a process for the production thereof. More particularly, the present invention relates to an electrophotographic light receiving member having a specific surface protective layer comprising a non-single crystalline carbon material and containing fluorine atoms at the outermost surface thereof and a process for the production thereof.

2. Related Background Art

For the materials used in electrophotographic light receiving members, there are known various inorganic materials such as selenium, cadmium sulfide, zinc oxide and amorphous silicon (hereinafter referred to as a-Si). Of these, non-single crystalline deposited films containing silicon atoms as a main component, typified by a-Si, such as amorphous deposited films of a-Si or the like in which the dangling bonds are compensated by adequate atoms such as hydrogen atoms and/or halogen atoms (for example, fluorine atoms or chlorine atoms) have been proposed to be suitable as materials for light receiving members having a high performance and a high durability and which are free of the occurrence of environmental pollution. Some of these already have been put into practical use.

For the formation of these deposited films, there are known various film-forming manners such as sputtering process, thermal CVD process wherein raw material gas is decomposed by thermal energy, optical CVD process wherein raw material gas is decomposed by light energy, and plasma CVD (plasma-assisted CVD) process wherein raw material gas is decomposed by plasma. Of these processes, for the film formation by means of the plasma CVD process, there are proposed various methods for forming a deposited film in a thin film state on a desired substrate made of glass, quartz, heat resistant synthetic resin, stainless steel, aluminum, or the like by decomposing raw material gas by way of glow discharge or the like using a high frequency (RF or VHF) or a microwave in order to form amorphous silicon deposited films usable in electrophotographic light receiving members. Some of these methods have been used in practice. Various apparatuses suitable for practicing these methods are known also.

Now, there are various proposals as will be described in the following, in order for such amorphous silicon deposited film used in electrophotography to be made so that it can provide a copied image having a further improved quality.

Japanese Unexamined Patent Publication No. 115551/1982 discloses a photoconductive member comprising a photoconductive layer constituted by an amorphous material containing silicon atoms as a matrix and at least either hydrogen atoms or halogen atoms and a surface barrier layer constituted by a non-photoconductive amorphous material containing carbon atoms as a matrix and hydrogen atoms disposed on said photoconductive layer.

U.S. Pat. No. 4,675,265 discloses an electrophotographic photosensitive member comprising a photoconductive layer constitutes an a-Si material and a surface protective layer constituted by a hydrogenated a-C (amorphous carbon) containing hydrogen atoms in an amount of 10 to 40 atomic % disposed on said photoconductive layer.

U.S. Pat. No. 4,664,999 discloses a process for producing an electrophotographic member by forming an a-Si photoconductive layer on a substrate, forming an a-C layer as a surface protective layer to protect said photoconductive layer with the use of a RF power, and incorporating fluorine atoms into said a-C layer by subjecting the a-C layer to a plasma discharge treatment with gas containing fluorine atoms with the use of a RF power.

Japanese Unexamined Patent Publication No. 317920/1994 discloses a process for producing an electrophotographic photosensitive member comprising a photoconductive layer constituted by a non-single crystalline silicon material containing silicon atoms as a matrix and an a-C surface protective layer containing hydrogen atoms in an amount of 8 to 45 atomic % using a high frequency power with an oscillation frequency of 20 MHz or more.

European Patent Publication EP-A-154160 discloses a process and an apparatus for producing an electrophotographic device having a top prohibition layer formed by a microwave plasma CVD process using a microwave (with an oscillation frequency of 2.45 GHz, for example) as a decomposition source for raw material gas.

Incidentally, in recent years, there is an increased demand for electrophotographic apparatuses to be improved in terms of their performance so that they can provide a high quality copied image at a high speed and also in terms of their pollution resistance so that they do not cause environmental pollution Particularly, in view of the pollution resistance, improvement is needed since electrophotographic apparatuses have been widely using all over the world under various environmental conditions. For instance, for electrophotographic apparatuses to be used in Southeast Asian countries, there is an increased demand for them to be improved so that they can stably provide a high quality copied image under environmental conditions with a high temperature and high humidity.

By the way, in conventional electrophotographic apparatuses (or conventional electrophotographic copying apparatuses), as charging and charge-eliminating means of their light receiving members, a corona assembly (corotron, scorotron) comprising a wire electrode (e.g., a metal wire such as a tungsten wire of 50 to 100 um diameter, coated with gold) and a shielding plate is used in almost all cases. More specifically, corona electric currents generated by applying a high voltage of about 4 to 8 kV to the wire electrode of the corona assembly effect the surface of the electrophotographic light receiving member to charge the surface of the light receiving member and/or eliminate charges therefrom. However, along with the corona discharge, a remarkable amount of ozone ($O_3$) is generated. The ozone thus generated oxidizes nitrogen in the air to produce nitrogen oxides ($NO_x$). The nitrogen oxides thus produced react with moisture in the air to produce nitric acid and the like. The products produced due to the corona discharge (hereinafter referred to as corona discharge products) such as nitrogen oxides and nitric acid sometimes adhere to and deposit on the light receiving member and its surrounding machinery to contaminate their surfaces. Particularly in the case where the electrophotographic apparatus is positioned under environmental conditions with a high humidity, because such corona discharge products have a strong hygroscopic property, the surface of the light receiving member having the corona discharge products deposited thereon exhibits a reduced resistance. This often results in entirely or partially reducing the charge retentivity to cause defective images such as unfocused images or smeared images (a state in that the charges on the surface of the light receiving member leak in a plane direction to cause deformation, or no formation of patterns of electrostatic latent images).

Further, the corona discharge products adhered on the inner surface of the shielding plate of the corona assembly evaporate and release not only during the time when the electrophotographic apparatus is operating but also during the time when it is not used, e.g., at night. The corona discharge products thus released adhere onto the surface of a region of the light receiving member situated in the vicinity of the charge opening of the corona assembly to further adsorb moisture, resulting in a reduction in the resistance of the surface of said region of the light receiving member. Because of this, there is a tendency for a first copy initially provided when the electrophotographic apparatus is operated after it has been unused over a long period of time, or subsequent several copies provided thereafter, to have an unfocused image or smeared image which corresponds to the above region of the light receiving member situated in the vicinity of the charge opening of the corona assembly. This phenomenon is liable to become significant where the corona assembly comprises an AC corona assembly.

Particularly where an electrophotographic a-Si light receiving member is used as the light receiving member, the occurrence of the foregoing unfocused image or smeared image due to the corona discharge products may become a significant problem. Particularly, the a-Si light receiving member is relatively lower in comparison with other electrophotographic light receiving members in terms of the charging efficiency and charge elimination efficiency (since the former requires a large quantity of corona charging electric currents in order to obtain a desired charging and charge elimination potential). Because of this, the charging and charge elimination by corona discharge applied onto the a-Si light receiving member are often carried out while increasing the quantity of charging electric currents by making the voltage applied to corona assembly higher than in the case of other light receiving members.

In addition, the a-Si light receiving member is mostly used in a high-speed electrophotographic apparatus. In such a case, the quantity of charging electric currents may reach, e.g., 2,000 uA. In this case, since the quantity of corona charging electric currents is proportional to the amount of ozone produced, the ozone may be produced in a large amount especially when the light receiving member is an a-Si light receiving member and the charging and charge elimination are carried out by corona charging, where the occurrence of the unfocused image or smeared image may become a significant problem. Further, in the case of using the a-Si light receiving member, it has an extremely high surface hardness compared to other electrophotographic light receiving members and because of this, the corona discharge products deposited on the surface of the a-Si light receiving member are liable to remain thereon without being removed.

In order to prevent these problems, a heating means is used as described hereafter. A heater for heating the a-Si light receiving member is installed inside of the a-Si light receiving member or hot air is blown to the a-Si light receiving member by means of a hot-air blower, whereby the surface of the a-Si light receiving member is heated to and maintained at a temperature of 30° to 50° C. to maintain the surface of the a-Si light receiving member in a dry state. By this means, the corona discharge products deposited on the surface of the a-Si light receiving member are prevented from absorbing moisture, where the surface resistance of the a-Si light receiving member is substantially prevented from being lowered and as a result, unfocused image or smeared image is prevented.

However, this manner of using the foregoing heating means (the heater or hot-air blower) entails a problem in that because the electrophotographic apparatus consumes additional electric power for conducting the heating means, the electric power consumed by the electrophotographic apparatus is increased and therefore, this method is not economical.

Separately, for instance, in the case of a household electrophotographic copying machine which is used with a power source of 100 V/15 A, when the foregoing heating means is installed therein, it is difficult to make the electric power consumed less than 15 A and in addition, the freedom for designing the household electrophotographic copying machine is often limited.

Now, where the electrophotographic apparatus having the foregoing heating means which has been kept under environmental conditions at a high temperature and high humidity while switching off the main power source of the apparatus itself over a long period of time, in order to attain the reproduction of a clear copy with neither an unfocused image nor a smeared image from the beginning immediately after switching on the power source, it is necessary that the heating means be always energized without switching off its power source. In this case, since the heating means is always energized though the main power source of the electrophotographic apparatus is switched off, there is a demand for making an improvement in this situation in terms of not only energy saving but also conservation of resources.

By the way, in a conventional electrophotographic apparatus, there is widely employed a system of forming a thin layer of a developer comprising a toner or a mixture of a toner and a carrier on a rotary cylindrical developer carrying member having a movable magnet or the like installed therein and electrostatically transferring said thin layer to the electrophotographic light receiving member having an electrostatic latent image formed thereon. Such system is disclosed, for instance, in Japanese Unexamined Patent Publications Nos. 43037/1979, 144865/1983, and 7451/1985. In this case, as the developer, there is used a developer containing magnetic particles, i.e., the foregoing mixture of a toner and a carrier, or a developer comprising a toner containing a magnetite but no carrier. However, this system is liable to entail such problems as will be described as follows. A portion of the rotary cylindrical developer carrying member facing the electrophotographic light receiving member is liable to expand due to the heat from the light receiving member when the electrophotographic apparatus is not operated where the distance between the rotary cylindrical developer carrying member and the light receiving member in a region for developing the developer is shortened to cause an increased electric field therebetween, which results in enhanced developer transferability. This also causes a portion opposite to said portion to have a longer distance between them, where the electric field becomes smaller and as a result, the developer is more difficult to transfer than usual. This situation is liable to cause problems such that when a halftone original is subjected to reproduction after the electrophotographic apparatus has not operated over a long period of time, there is sometimes afforded a reproduced image accompanied by an uneven density which is partially dense or thin depending upon the rotational period of the rotary cylindrical developer carrying member.

Also in order to prevent the occurrence of these problems, there is an increased demand for providing a desirable electrophotographic light receiving member which can provide a high quality reproduced image with neither an unfocused image nor a smeared image, even when it is heated as above described.

Further, for the conventional electrophotographic a-Si light receiving member, further problems need to be resolved other than the foregoing problems relating to the image density. Particularly, electric potential upon charging (the charge retentivity) is not sufficient in comparison with an electrophotographic light receiving member comprising OPC or selenium and therefore, in order to attain a further improvement in the quality of an image reproduced, it is necessary for the a-Si light receiving member to be made such that a development contrast capable of absorbing a change in the charge retentivity, which occurs when the temperature of the a-Si light receiving member is changed, is ensured while precisely adjusting the conditions in the image-forming process. In view of this, it is required for the conventional a-Si light receiving member to be made such that it has a further improved charge retentivity which slightly changes depending upon the temperature thereof.

SUMMARY OF THE INVENTION

The present invention is aimed at eliminating the foregoing disadvantages found in the conventional electrophotographic light receiving member and providing an improved electrophotographic light receiving member which is free of those disadvantages.

Another object of the present invention is to provide an improved electrophotographic light receiving member which is substantially free of the deposition of such corona discharge products caused upon corona discharging found in the prior art, which reproduces a high quality image with neither an unfocused image nor a smeared image without using such heating means as in the prior art, which is not necessary to be energized as in the prior art when turned off at night, and which can be desirably used in an electrophotographic apparatus with an advantage in that the electric power can be saved.

A further object of the present invention is to provide an improved electrophotographic light receiving member which reproduces a high quality halftone image with no density unevenness from a halftone original even after having been turned off over a long period of time.

A further object of the present invention is to provide an improved electrophotographic light receiving member which is sufficient enough in the charge retentivity and high enough in the photosensitivity and which reproduces a highly dense and clear image.

A further object of the present invention is to provide a process which enables one to efficiently produce the above light receiving member with a reasonable production cost.

A typical embodiment of the electrophotographic light receiving member according to the present invention comprises a electrically conductive substrate, a photoconductive layer composed of a non-single crystalline material containing at least silicon atoms as a matrix which is formed on said substrate by decomposing a silicon-containing raw material gas, and a surface protective layer composed of a non-single crystalline carbon material containing hydrogen atoms which is formed on said photoconductive layer by decomposing a raw material gas comprising at least a hydrocarbon using a very high frequency (VHF) power with an oscillation frequency of 50 MHz to 450 MHz, wherein a 20 Å or more thick surface side layer region of said surface protective layer composed of said non-single crystalline carbon material is etched at an etching speed of 0.1 to 50 Å/sec. by means of a fluorine-containing plasma produced by decomposing a fluorine-containing gas using a very high frequency (VHF) power with an oscillation frequency of 50 MHz to 450 MHz such that said surface protective layer has a thickness of 100 to 10000 Å and has an etched surface deposited with fluorine atoms so as to cover said etched surface.

A typical embodiment of the process according to the present invention comprises the steps of: placing an electrically conductive substrate in a deposition chamber capable of being vacuumed and which is provided with an exhaust means and a means for introducing a raw material gas thereinto, forming a photoconductive layer composed of a non-single crystalline material containing at least silicon atoms as a matrix on said substrate by decomposing a silicon-containing raw material gas, forming a surface protective layer composed of a non-single crystalline carbon material containing hydrogen atoms on said photoconductive layer by decomposing a raw material gas comprising at least a hydrocarbon using a very high frequency (VHF) power with an oscillation frequency of 50 MHz to 450 MHz, and etching a 20 Å or more thick surface side layer region of said surface protective layer at an etching speed of 0.1 to 50 Å/sec. by means of a fluorine-containing plasma produced by decomposing a fluorine-containing gas using a very high frequency (VHF) power with an oscillation frequency of 50 MHz to 450 MHz such that said surface protective layer has a thickness of 100 to 10000 Å and has an etched surface deposited with fluorine atoms so as to cover said etched surface, to thereby produce an electrophotographic light receiving member.

The present invention has been accomplished based on findings which will be described below, obtained through experimental studies by the present inventors.

In order to solve the foregoing problems relating to the electric power consumption and the occurrence of an unfocused image and a smeared image which are found in the case of using the conventional electrophotographic a-Si light receiving member, the inventors considered that it is basically necessary to eliminate the use of the foregoing heating means.

On the basis of this view, the present inventors firstly conducted studies of pollution resistance when the heating means is not used in the case of using the conventional electrophotographic a-Si light receiving member. As a result, there was obtained a finding which will be described as follows. For the conventional electrophotographic a-Si light receiving member having a surface protective film composed of a material such as amorphous silicon carbide (a-SiC), amorphous silicon nitride (a-SiN) or amorphous silicon oxide (a-SiO), when it is subjected to electrophotographic image-forming process, its surface is gradually oxidized by ozone produced upon conducting corona charging to form a silicon oxide having a hydrophilic property, whereby the water repellency of the surface of the surface protective layer is deteriorated. (The water repellency herein is evaluated based on a contact angle against water when a droplet of pure water is positioned on a surface of a specimen. The greater the contact angle, the higher the water repellency.)

Now, it is known that when the water repellency of the surface of an electrophotographic light receiving member is decreased, a product occurs due to ozone reaction which forms on the surface of the light receiving member and readily absorbs moisture, resulting in a smeared image under high humidity environmental condition.

And U.S. Pat. No. 4,675,265 describes that an amorphous carbon (a-C) film is highly water-repellent and is difficult to oxidize by ozone. The film can meet the conditions for a surface protective layer of an electrophotographic a-Si light receiving member which are that the film should be transparent, very hard and highly electrically resistant.

In view of this, the present inventors prepared an electrophotographic light receiving member having a surface protective layer comprising an a-C film disposed on an a-Si photoconductive layer. And the resultant light receiving member was subjected to durability test under environmental conditions with a high temperature and high humidity without using the foregoing heating means. As a result, there were obtained findings as will be described as follows. The light receiving member is superior to a conventional light receiving member having a surface protective layer composed of an a-SiC, a-SiN or a-SiO disposed on an a-Si photoconductive layer in durability test in which copying is continuously conducted without using the foregoing heating means. However, the reproduction of a copy satisfactory in image quality is present only until about 5,000 copies are made and copies reproduced thereafter gradually are accompanied by an unfocused image. And the situation of causing said unfocused image is gradually worsened as the copying is continued. Therefore, it is difficult to continuously obtain a greater volume of satisfactory copies without using the heating means.

Though previously described, U.S. Pat. No. 4,664,999 describes, for an electrophotographic a-Si light receiving member, a manner of improving the durability of the surface protective layer under high humidity environmental conditions by using an a-C film formed with the use of RF power, which is made to have a high water repellency, as the constituent of the surface protective layer. In accordance with the method described in this patent document, the present inventors prepared an electrophotographic light receiving member by forming an a-C film as a surface protective layer on an a-Si photoconductive layer using a RF power with 13.56 MHz and subjecting said a-C film to plasma discharge treatment with a fluorine-containing gas using a RF power with an oscillation frequency with 13.56 MHz. For the resultant light receiving member, evaluation was conducted with respect to the water repellency of the surface protective layer. As a result, it was found that the rate for the water repellency of the surface protective layer to be deteriorated in relation to the period of time for ozone irradiated to the surface protective layer, is lowered. Successively, the light receiving member was installed in an electrophotographic apparatus, and the electrophotographic apparatus was subjected to durability tests under environmental conditions with a high temperature and high humidity without using the foregoing heating means, where copying was continuously conducted. The results revealed the following facts. The reproduction of a copy satisfactory in the image quality occurs until about 50000 copying sheets and copies reproduced thereafter gradually are accompanied by a smeared image. And the situation of causing said smeared image is gradually worsened as the copying is continued. Therefore, it is difficult to continuously obtain a greater volume of satisfactory copies without using the heating means.

Then, for the light receiving member having been subjected to the durability test, the atom arrangement structure of the outermost surface of the protective layer was examined by way of XPS (ESCA) analysis. As a result, it was found that substantially no fluorine atom but carbon atoms are present and instead of the fluorine atoms, oxygen atoms are present in the outermost surface of the surface protective layer.

As a result of making studies based on these findings, the following facts were obtained. That is, even in the case where the surface of the a-C film as the surface protective layer of the a-Si light receiving member is subjected to the plasma discharge treatment with the fluorine-containing gas, where the surface is continuously exposed to severe conditions of charging, development, transfer and cleaning in the electrophotographic apparatus, the bonds among fluorine atoms and carbon atoms in the outermost surface of the surface protective layer are broken to release the fluorine atoms therefrom. Where dangling bonds are generated, and the dangling bonds bonded with ozone to cause the formation of oxides (as well as in the case where such plasma discharge treatment is not conducted), a reproduced image is smeared.

While taking the above findings into consideration, on the condition of using an a-C film as the surface protective layer of an electrophotographic light receiving member, the present inventors conducted various studies while variously changing the conditions for the film formation and for surface treatment. Particularly, with reference to the description of Japanese Unexamined Patent Publication No. 317920/1994 (previously described), there were formed a plurality of a-C films using a VHF power with an oscillation frequency in the range of 50 to 450 MHz. For the resultant a-C films, their hardness was examined. As a result, these a-C films were found to have a satisfactory hardness and transparency which are superior to those of the conventional a-C film formed using the high frequency power with 13.56 MHz.

And there were prepared a plurality of electrophotographic light receiving members each having a surface protective layer comprising one of these a-C film disposed on an a-Si photoconductive layer. Each of the resultant light receiving members was subjected to durability test, where copying was continuously conducted without using the foregoing heating means. As a result, any of these light receiving members each having a surface protective layer comprising one of the a-C films formed with the VHF power with 50 to 450 MHz is superior to the foregoing conventional light receiving member having the surface protective layer comprising the a-C film formed with the high frequency power with 13.56 MHz and subjected to the plasma discharge treatment. Particularly, the situation of causing a smeared image in the latter was markedly improved in the former.

In order to further improve the durability of any of these a-C films formed with the VHF power with 50 to 450 MHz under environmental conditions with a high temperature and high humidity and also in order to improve these a-C films so that they are sufficiently durable in practice even when continuously used without using the foregoing heating means, the present inventors conducted experimental studies by subjecting these a-C films to surface treatment. Particularly, there were prepared a plurality of electrophotographic light receiving members each having a surface protective layer comprising one of these a-C films disposed on an a-Si photoconductive layer. For each of the resultant light receiving members, the contact angle against water of the surface protective layer was measured. Then, each light receiving member was exposed to a plasma generated by causing plasma discharge in a gas selected from the group consisting of hydrogen gas, oxygen gas, argon gas or halogen gas to etch the surface of the surface protective layer. For each light receiving member thus treated, the etched outermost surface of the surface protective layer was examined with respect its contact angle against water. As a result, for the light receiving members having been subjected to the surface treatment with hydrogen plasma, substantially no difference was observed between their contact angles against water before and after the surface treatment. For the light receiving members having been subjected to the surface treatment with oxygen plasma or argon plasma, their contact angles against water after the surface treatment were found to be distinguishably inferior to their contact angles against water before the surface treatment. For the light receiving members having been subjected to the surface treatment with halogen plasma, their contact angles against water after the surface treatment were found to be apparently superior to their contact angles against water before the surface treatment. Particularly, it was found that the surface treatment with fluorine plasma provides a marked improvement in the contact angle against water.

Based on the facts found in the above, for the surface treatment (or the etching treatment) with fluorine plasma, the present inventors conducted experimental studies in order to determine out an optimum condition for providing an excellent outcome. As a result, it was found that by using a very high frequency (VHF) power with an oscillation frequency of 50 to 450 MHz, there can be attained a significantly improved durability for the a-C film.

From the above-described findings, it was determined that by subjecting an a-C film formed using a very high frequency (VHF) power of 50 to 450 MHz to etching treatment with fluorine plasma using a very high frequency (VHF) power of 50 to 450 MHz, there can be produced a desirable surface protective layer for a light receiving member for use in electrophotography, having a surface with a significantly improved durability which hardly causes the occurrence of a smeared image in a reproduced image.

The reason for this is not clear for the time being. However, it is hypothesized that the following occurs. Hydrocarbon gases such as $CH_4$, $C_2H_6$, and the like usually used as a starting material for the formation of an a-C film have a high bond energy and are difficult to be decomposed. Therefore, when the formation of an a-C film is conducted by way of plasma discharge with the application of a high frequency power with a low oscillation frequency of 13.56 MHz in any of these hydrocarbon gases, the hydrocarbon gas cannot be sufficiently decomposed by the application of this high frequency power, where the a-C film obtained does not have a sufficiently bonded three-dimensional network structure. On the other hand, when the formation of an a-C film is conducted by way of plasma discharge with the application of a VHF power with 50 to 450 MHz in any of said hydrocarbon gases, an energy based on the VHF power is sufficiently supplied into the hydrocarbon gas, whereby the hydrocarbon gas is sufficiently decomposed to cause the formation of a desirable a-C film having a strongly bonded and highly dense three-dimensional network structure with a small number of dangling bonds.

For the a-C films, the interrelation between their film structure and oxidation resistance is not clear enough for the time being. However, for the a-C film formed by way of VHF plasma discharge, it is considered such that the a-C film has a highly dense three-dimensional network structure with a small number of dangling bonds as above described and therefore, the a-C film has an outermost surface with a small number of dangling bonds, which is therefore extremely low in terms of the surface activity. Because of this, the surface of the a-C film is difficult to be reacted with products caused by ozone which are deposited thereon.

Further, the present inventors prepared a plurality of electrophotographic light receiving members each having a surface protective layer formed by forming an a-C film by way of plasma discharge with the application of a VHF power with 50 to 450 MHz in a given hydrocarbon gas and subjecting said a-C film to surface etching treatment with a fluorine plasma generated by way of plasma discharge in a given fluorine-containing gas using a VHF power with 50 to 450 MHz. For each of the resultant light receiving members, its outermost surface was subjected to XPS analysis. As a result, the outermost surface of each light receiving member was found to contain fluorine atoms such that the outermost surface is covered by said fluorine atoms. Then, each light receiving member was subjected to durability test, where copying shot was continuously conducted more than 50000 times. For each of the light receiving members having subjected to the durability test, its outermost surface was subjected to XPS analysis. As a result, the outermost surface of each light receiving member was found to still contain fluorine atoms such that the outermost surface is covered by said fluorine atoms, as well as in the case before the durability test. In accordance with the detected concentrations and analyzed results obtained by the XPS analysis, for the reason for this, it is considered such that the fluorine atoms are bonded to all the dangling bonds exposed at the outermost surface of the surface protective layer (comprising the a-C film) of each light receiving member and because of this, the fluorine atoms are still present so as to cover substantially the entire of the outermost surface of the surface protective layer.

As the fluorine-containing gas used for generating the fluorine plasma for the surface etching treatment, there can be mentioned $CF_4$ gas, $C_2F_6$ gas, and the like. These fluorine-containing gases are more difficult to be decomposed than the foregoing hydrocarbon gases. In view of this, it is considered that in order to sufficiently decompose these fluorine-containing gases, it is necessary to use a VHF power with 50 to 450 MHz.

Further, as above described, only in the case where an a-C film formed by way of plasma discharge in a given hydrocarbon gas with the application of a VHF power with 50 to 450 MHz is subjected to surface etching treatment with fluorine plasma generated by way of plasma discharge in a given fluorine-containing gas with the application of a VHF power with 50 to 450 MHz, there can be attained the formation of a desirable surface protective layer for an electrophotographic light receiving member, having a significantly improved durability. In this respect, it is considered that the use of the specific VHF power in the formation of the a-C film and also in the surface etching treatment of the a-C film provides not only an effect of efficiently and sufficiently decomposing the raw material gas used but also another effect of causing a covalent bond-like state for the fluorine atoms present at the outermost surface of the a-C film as the surface protective layer of the light receiving member in which the fluorine atoms are strongly bonded in such a state that the fluorine atoms are hardly released even when the surface protective layer is exposed to severe environmental conditions in the electrophotographic image-forming process or even when the protective surface layer suffers from mechanical friction.

Further in addition, the present inventors prepared a plurality of electrophotographic light receiving members each having a surface protective layer formed by forming an a-C film by way of plasma discharge with the application of a VHF power with 50 to 450 MHz in a given hydrocarbon gas and subjecting said a-C film to surface etching treatment with a fluorine plasma generated by way of plasma discharge in a given fluorine-containing gas using a VHF power with 50 to 450 MHz. For each of the resultant light receiving members, evaluation was conducted with respect to its electrical characteristics. As a result, there was observed an unexpectedly improved charge retentivity which is slightly varied against temperature changes, for these light receiving members. This effect was not observed in the case of a light receiving member having a surface protective layer comprising an a-C film formed by way of plasma discharge with the application of a high frequency power in a hydrocarbon gas. Based on these facts, it is considered that the use of the specific VHF power in the formation of the a-C film and also in the surface etching treatment of the a-C film effects in making the fluorine atoms present in the outermost surface of the a-C film as the surface protective layer to selectively and strongly bond to structural defects (or surface states) present in said outermost surface in a covalent bond-like state and as a result, almost all the structural defects are passivated, whereby a charge is desirably prohibited from injecting from the surface protective layer side to restrain a variation in the amount of the charge injected due to temperature changes of the surface protective layer. It can be said that this passivation phenomenon occurred in the outermost surface of the surface protective layer indicates that the film-forming manner of providing the above carbon-fluorine bond state by the use of the specific VHF power in the formation of the a-C film and also in the surface etching treatment of the a-C film is apparently distinguished from other film-forming manners.

BRIEF DESCRIPTION OF THE DRAWINGS

FIG. 3 is a schematic cross-sectional view illustrating a further embodiment of an electrophotographic light receiving member according to the present invention.

DESCRIPTION OF THE INVENTION AND PREFERRED EMBODIMENTS

Figure 1:
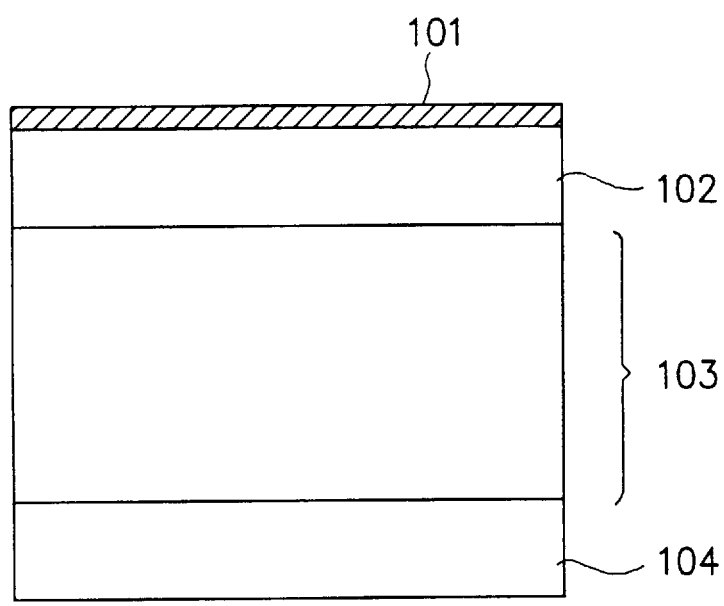
FIG. 1 is a schematic cross-sectional view illustrating an embodiment of a light receiving member for use in electrophotography (or an electrophotographic light receiving member) according to the present invention.

The present invention provides an electrophotographic light receiving member comprising a electrically conductive substrate, a photoconductive layer composed of a non-single crystalline material containing at least silicon atoms as a matrix formed on said substrate by decomposing a silicon-containing raw material gas, and a surface protective layer composed of a non-single crystalline carbon material containing hydrogen formed on said photoconductive layer by decomposing a raw material gas comprising at least a hydrocarbon using a high frequency power with an oscillation frequency of 50 MHz to 450 MHz, wherein a 20 Å or more thick surface side layer region of said surface protective layer composed of said non-single crystalline carbon material is etched at an etching speed of 0.1 to 50 Å/sec. by means of a fluorine-containing plasma produced by decomposing a fluorine-containing gas using a high frequency power with an oscillation frequency of 50 MHz to 450 MHz such that said surface protective layer has a thickness of 100 to 10000 Å and has an etched surface deposited with fluorine atoms so as to cover said etched surface.

The present invention also provides a process for producing an electrophotographic light receiving member, comprising the steps of:

(a) placing an electrically conductive substrate in a deposition chamber capable of being vacuumed and which is provided with an exhaust means and a means for introducing a raw material gas thereinto, (b) forming a photoconductive layer composed of a non-single crystalline material containing at least silicon atoms as a matrix on said substrate by decomposing a silicon-containing raw material gas, (c) forming a surface protective layer composed of a non-single crystalline carbon material containing hydrogen atoms on said photoconductive layer by decomposing a raw material gas comprising at least a hydrocarbon using a high frequency power with an oscillation frequency of 50 MHz to 450 MHz, and (d) etching a 20 Å or more thick surface side layer region of said surface protective layer at an etching speed of 0.1 to 50 Å/sec. by means of a fluorine-containing plasma produced by decomposing a fluorine-containing gas using a high frequency power with an oscillation frequency of 50 MHz to 450 MHz such that said surface protective layer has a thickness of 100 to 10000 Å and has an etched surface deposited with fluorine atoms so as to cover said etched surface, to thereby produce an electrophographic light receiving member.

In the present invention, there can be attained an aimed significant effect only in the case where a non-single crystalline carbon film formed using a very high frequency (VHF) power with an oscillation frequency of 50 to 450 MHz is subjected to etching treatment with a fluorine-containing plasma produced using a VHF power with an oscillation frequency of 50 to 450 MHz at a specific etching speed of 0.1 to 50 Å/sec.

Particularly, in the formation of a surface protective layer for an electrophotographic light receiving member, in the case where the two steps, i.e., a first step of forming a non-single crystalline carbon film using a specific VHF power with an oscillation frequency of 50 to 450 MHz and a second step of subjecting said non-single crystalline carbon film to etching treatment with a fluorine-containing plasma produced from a fluorine-containing gas using a specific VHF power with an oscillation frequency of 50 to 450 MHz at a specific etching speed of 0.1 to 50 Å/sec. are sequentially conducted, there can be attained the formation of a desirable surface protective layer having an excellent surface state in the outermost surface thereof in which a carbon-carbon bond state and a carbon-fluorine bond state are optimally matched.

The non-single crystalline carbon film as the constituent of the surface protective layer can include a polycrystalline carbon film, a microcrystalline carbon film and an amorphous carbon film (an a-C film). Of these, the amorphous carbon film is the most appropriate. The amorphous carbon film may contain a microcrystalline carbon material.

For the thickness of the non-single crystalline film to be etched in the above-described second step, when it is about 20 Å or more, there can be attained a sufficient effect. In a preferred embodiment, it is made to be 100 Å or more. In this case, there can be attained an improved effect and a sufficient reproducibility.

For the range of the etching speed in the above-described second step, it has been found out as a result of experimental studies by the present inventors. Particularly, the present inventors prepared a plurality of electrophotographic light receiving members each having a different surface protective layer formed by forming a non-single crystalline carbon film by way of plasma discharge with the application of a VHF power with an oscillation frequency of 50 to 450 MHz and etching a surface side layer region of said non-single crystalline film with a plasma produced from a fluorine-containing gas selected from the group consisting of $CF_4$, $C_2F_6$, and $CHF_3$ with the application of a VHF power (with an oscillation frequency of 50 to 450 MHz) of a given wattage at a given etching speed. For each of the resultant light receiving members, the outermost surface state of the surface protective layer was examined, and the durability of the surface protective layer in the electrophotographic image-forming process was examined.

As a result, for the light receiving members having a surface protective layer formed by way of the surface etching treatment at an etching speed in the range of from 0.1 to 50 Å/sec., their surface layers were found to have an outermost surface having an excellent surface state with no surface local level and in which a carbon-carbon bond state and a carbon-fluorine bond state are optimally matched and fluorine atoms are present so as cover substantially the entire of the outermost surface. Further, for their surface protective layers, it was also found that their outermost surfaces have a sufficient durability which can endure against continuous copying over a long period of time without being deteriorated and without the fluorine atoms present therein being removed.

For the light receiving members having a surface layer formed by way of the surface etching treatment at an etching speed of less than 0.1 Å/sec., it was found that their surface protective layers have an outermost surface inferior in surface state and they are inferior in durability. For the reason for this, it is considered such that in the case where the etching speed is made to be less than 0.1 Å/sec., substantially no fluorine radical is present in the plasma by which the non-single crystalline carbon film is etched and because of this, dangling bonds present in the outermost surface are not sufficiently compensated by fluorine atoms. For the light receiving members having a surface layer formed by way of the surface etching treatment at an etching speed of beyond 50 Å/sec., it was also found that their surface protective layers have an outermost surface inferior in surface state and they are inferior in durability. For the reason for this, it is considered such that in the case where the etching speed is made to be beyond 50 Å/sec., the non-single crystalline carbon film is rapidly etched into an uneven state in that its portions liable to be readily etched are convergently etched to form porous regions having a property of readily absorbing moisture.

For the thickness of the surface protective layer resulted after the etching treatment, it is desired to be in the range of 100 to 10000 Å. When the thickness is less than 100 Å, there cannot be attained a sufficient mechanical strength for the surface protective layer. Particularly, in the case where the surface layer is made to have a thickness of less than 100 Å, for instance when copying papers are jammed in an electrophotographic apparatus to cause a defect at the surface protective layer, the defect is occasionally extended into the photoconductive layer to make the light receiving member useless. On the other hand, when the surface protective layer is made to have a thickness of beyond 10000 Å, a a problem is liable to entail in that the quantity of light absorbed by the surface protective layer is increased to the light receiving member not to exhibit a sufficient photosensitivity, where a defective reproduced image which is accompanied by a fogged image or is insufficient in density.

As above described, a principal feature of the present invention lies in an improved surface protective layer for an electrophotographic light receiving member, having a specific outermost surface having an extremely high water repellency and an extremely improved durability formed by the foregoing specific manner in which an non-single crystalline carbon film formed using a VHF power with a specific oscillation frequency of 50 to 450 MHz is subjected to surface etching treatment using a VHF power with a specific oscillation frequency of 50 to 450 MHz and at a specific etching speed.

In the following, the present invention will be described with reference to the drawings.

FIG. 1 is a schematic cross-sectional view illustrating an embodiment of an electrophotographic light receiving member according to the present invention.

In FIG. 1, reference numeral 102 indicates a surface protective layer comprising a non-single crystalline carbon film (for example, an a-C film) formed using a VHF power with an oscillation frequency of 50 to 450 MHz. Reference numeral 101 indicates a region having an outermost surface deposited with fluorine atoms so as to cover substantially the entire thereof which is formed by subjecting a surface side layer region of said non-single crystalline carbon film 102 to etching treatment with a fluorine-containing plasma produced by way of plasma discharge with the application of a VHF power with an oscillation frequency of 50 to 450 MHz in a fluorine-containing gas at a etching speed of 0.1 to 50 Å/sec. Reference numeral 103 indicates a photoconductive layer composed of a non-single crystalline material containing silicon atoms as a matrix, reference numeral 104 an electrically conductive substrate.

As above described, the surface protective layer 102 is comprised of a non-single crystalline carbon material (for example, an a-C). The surface protective layer 102 may be formed by way of plasma discharge with the application of a VHF power with an oscillation frequency of 50 to 450 MHz in a hydrocarbon gas as a film-forming raw material gas. The surface protective layer 102 is desired to be high in transparency in view of attaining a sufficient photosensitivity for an electrophotographic light receiving member. For this purpose, if necessary, it is possible to mix a gas such as $H_2$, He, or Ar into said film-forming raw material gas upon the formation of the surface protective layer. In the formation of the surface protective layer, the substrate temperature is adjusted in the range of room temperature to 350° C. In the case where the substrate temperature is excessively high, the resulting surface protective layer will become such that has a low band gap and therefore, is insufficient in transparency. Because of this, the substrate temperature is desired to be relatively low.

As the film-forming raw material gas which can supply carbon atoms (C) in the formation of the surface protective layer 102, gaseous or easily gasifiable hydrocarbons can be optionally used. Specific example of such hydrocarbon are $CH_4$, $C_2H_6$, $C_3H_8$, $C_4H_{10}$, and the like. Of these, $CH_4$ and $C_2H_6$ are most preferred in view of easy handling upon forming the surface protective layer and high C-supplying efficiency. These C-supplying raw material gases may be diluted, if required, with a gas such as $H_2$, He, Ar or Ne.

For the wattage of the VHF power applied in the formation of the surface protective layer, it is desired to be relatively high in order to facilitate the decomposition of the hydrocarbon raw material gas. Specifically, it is desired to be 10 W/cc or more against the hydrocarbon raw material gas. When the wattage of the VHF power applied is excessively high, a problem is liable to entail in that abnormal discharge is occurred and because of this, a desirable surface protective layer cannot be formed and in addition, the characteristics of the photoconductive layer situated under the surface protective layer is deteriorated. Therefore, it should be adjusted in a range where no abnormal discharge is occurred.

For the inner pressure upon forming the surface surface protective layer (which means the inner pressure in a discharge space of a deposition chamber used), since the VHF power with an oscillation frequency of 50 to 450 MHz is used, stable discharge can be generated even at a relatively high vacuum degree. And the foregoing hydrocarbon raw material gas is difficult to be decomposed and therefore, when decomposed species are collided with each other in the vapor phase, polymerized materials are liable to produce. In view of this, the inner pressure is desired to be set at a higher vacuum degree as much as possible. Specifically, it is preferably 100 mTorr or less, more preferably 50 mTorr or less, most preferably 10 mTorr or less.

When the inner pressure in the discharge space is made to be 10 mTorr or less, there can be attained the formation of a non-single crystalline carbon film excelling in transparency as the surface protective layer 102 which can desirably attain a sufficient photosensitivity for the resulting electrophotographic light receiving member. In any case, the lower limit for the inner pressure in the discharge space may be lowered as lower as possible in a range where discharge can be stably generated.

The formation of the range 101 may be formed by forming a surface protective layer 102 comprised of a non-single crystalline material (for example, an a-C) on a substrate 104 having a photoconductive layer 103 previously formed thereon in the deposition chamber in the above described manner, introducing a fluorine-containing gas into the deposition chamber, and simultaneously with this, applying a VHF power with an oscillation frequency of 50 to 450 MHz into the deposition chamber to generate a fluorine-containing plasma, whereby etching a predetermined surface side layer region of the surface protective layer 102 to form the region 101 having an outermost surface deposited with fluorine atoms so as to cover substantially the entire of the outermost surface. For the oscillation frequency of the VHF power in this case, it may be any oscillation frequency in the range of 50 to 450 MHz. However, to use an oscillation frequency near 100 MHz is particularly preferred in view of attaining uniform surface etching treatment. In the case of using an oscillation frequency in a microwave region of more than 0.5 GHz, the etching efficiency is excessively large and because of this, such a porous region as previously described is liable to form, where the object of the present invention cannot be attained.

For the wattage of the VHF power applied in the surface etching treatment, it should be determined in the range of 10 W to 5000 W in connection with an etching speed employed.

For the inner pressure in the surface etching treatment, it should be determined in the range of 1 mTorr to several Torr in connection with the etching speed employed.

For the etching speed in the surface etching treatment, it should be determined in the range of 0.1 Å/sec. to 50 Å/sec. as previously described.

The etching speed is closely related to the flow rate of the fluorine-containing gas, the wattage of the VHF power and the substrate temperature. Particularly, it has a tendency that it speeds as the flow rate of the fluorine-containing gas, the wattage of the VHF power or the substrate temperature is increased. Therefore, the etching speed in the above range should be determined in relation to these factors. In practice, it is adopted based on a calibration curve previously established with respect to a given flow rate of the fluorine-containing gas, a given wattage of the VHF power, and a given substrate temperature.

As the fluorine-containing gas used in the surface etching treatment, there can be mentioned, for example, $CF_4$, $C_2F_6$, $CHF_3$, $C_3F_8$, $C_4F_{10}$, and $CHClF_2$. Besides these, $ClF_3$ and $F_2$ are also usable.

For the thickness of the surface protective layer 102 to be etched, to etch its surface side layer region of at least 20 Å in thickness can attain the object of the present invention. When the layer thickness of 100 Å or more is etched, uniform surface etching can be efficiently conducted. In any case, the layer thickness to be etched may be properly determined in the range of 20 Å to 100 Å or more. However, in view of easy of the control and industrial productivity, it is desired to be in the range of 1000 to 5000 Å.

For the etching speed in the surface etching treatment, it should be determined in the range of 0.1 to 50 Å/sec. for the previously described reasons.

For the photoconductive layer 103, it may comprise a non-single crystalline material containing silicon atoms as a matrix as previously described. The formation of the photoconductive layer 103 may be conducted by a glow discharge decomposition process using a high frequency power with any oscillation frequency or a microwave power. For instance, the photoconductive layer may be formed by causing glow discharge with the application of said high frequency power or microwave power in a raw material gas capable of supplying silicon atoms (Si).

The photoconductive layer 103 in FIG. 1 comprises a single layer having photoconductivity constituted by a non-single crystalline material containing silicon atoms as a matrix and which is not functionally divided.

Figure 2:
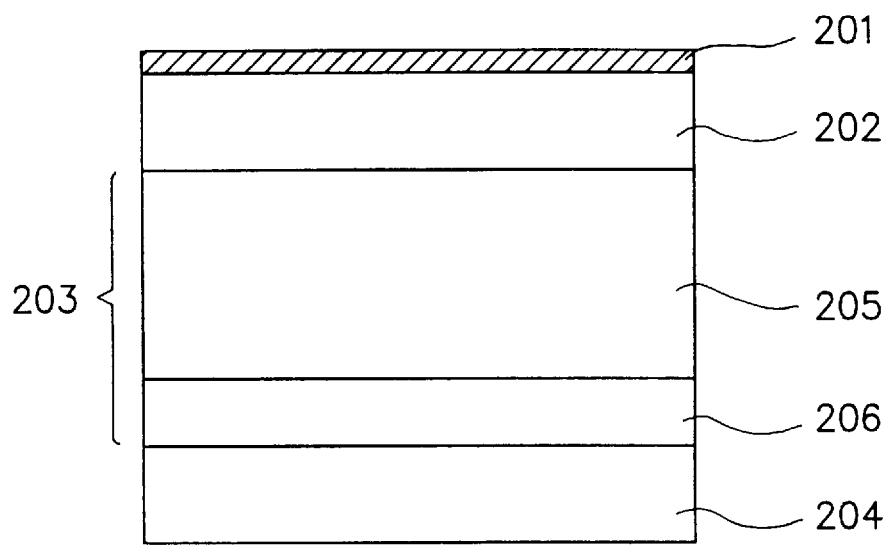
FIG. 2 is a schematic cross-sectional view illustrating another embodiment of an electrophotographic light receiving member according to the present invention.

Besides this, the electrophotographic light receiving member may be configured as shown in FIG. 2 or 3. Particularly, FIG. 2 is a schematic cross-sectional view illustrating another embodiment of an electrophotographic light receiving member, and FIG. 3 is a schematic cross-sectional view illustrating a further embodiment of an electrophotographic light receiving member. Any of the light receiving members shown in FIGS. 2 and 3 is a modification of the light receiving member shown in FIG. 1 in which the photoconductive layer 103 of the light receiving member shown in FIG. 1 is modified into a photoconductive layer having a multi-layered structure.

The light receiving member shown in FIG. 2 comprises an electrically conductive substrate 204, a two-layered photoconductive layer 203 disposed on the substrate 204 and which comprises a lower blocking layer 206 capable of preventing a carrier from injecting from the substrate 204 side and a layer 205 having photoconductivity constituted by a non-single crystalline material containing at least silicon atoms stacked in the named order on the substrate 204, and a surface protective layer 202 having a region 201 formed thereon and which is stacked on the photoconductive layer 203. The surface protective layer 202 is of the same meaning as the surface protective layer 102 in FIG. 1, and the region 201 is of the same meaning as the region 101 in FIG. 1.

The light receiving member shown in FIG. 3 comprises an electrically conductive substrate 304, a two-layered photoconductive layer 303 disposed on the substrate 304 and which comprises a charge transportation layer 306 constituted by an non-single crystalline material at least silicon atoms and carbon atoms and a charge generation layer 305 constituted by a non-single crystalline material containing at least silicon atoms stacked in the named order on the substrate 304, and a surface protective layer 302 having a region 301 formed thereon and which is stacked on the photoconductive layer 303. The surface protective layer 302 is of the same meaning as the surface protective layer 102 in FIG. 1, and the region 301 is of the same meaning as the region 101 in FIG. 1.

In the light receiving member shown in FIG. 3, when the light receiving member is subjected to light irradiation, a carrier generated principally in charge generation layer 305 passes through the charge transportation layer 306 to arrive at the substrate 304.

In the light receiving member in FIG. 3, it is possible to configure the photoconductive layer 303 such that the charge transportation layer 305 is positioned on the substrate 304 side and the charge generation layer 306 is position on the charge transportation layer.

In any of the light receiving members shown in FIGS. 1 to 3, the thickness of the photoconductive layer should be properly determined depending upon the related factors such as charge retentivity, photosensitivity and the like required for an electrophotographic apparatus in which it is used and also having a due care about working efficiency. However, in general, the thickness of the photoconductive layer is desired to be determined in the range of 1 to 50 $\mu$m. This is based on conditions in that in view of the charge retentivity and photosensitivity, it is desired to be 10 $\mu$m or more and in view of the working efficiency, it is desired to be 50 $\mu$m or less.

The electrophotographic light receiving may be produced by means of an appropriate glow discharge decomposition film-forming apparatus.

Figure 4:
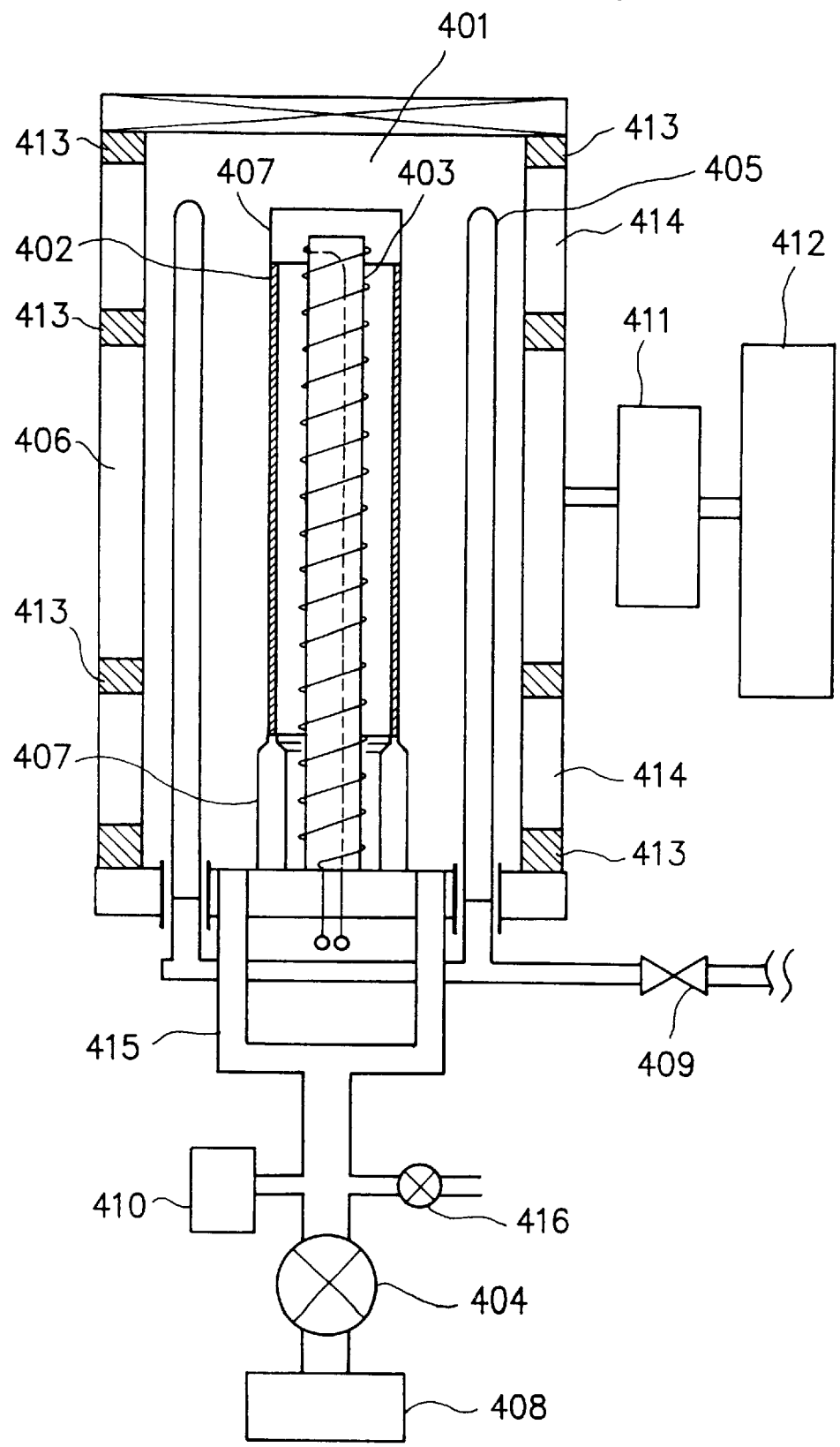
FIG. 4 is a schematic diagram illustrating a film-forming apparatus by a very high frequency (VHF)-plasma CVD process for producing an electrophotographic light receiving member.

FIG. 4 is a schematic diagram illustrating an example of such apparatus comprising a plasma CVD apparatus provided with a high frequency power source capable of supplying a VHF power with 50 to 450 MHz, suitable for producing an electrophotographic light receiving member according to the present invention.

The plasma CVD apparatus shown in FIG. 4 comprises a reaction chamber 401 (or a deposition chamber) having a discharge space, an exhaust system containing a vacuum pump 408 for evacuating the inside of the reaction chamber, and a raw material gas supply system (not shown) having gas reservoirs (not shown) for supplying a raw material gas into the reaction chamber 401.

The reaction chamber 401 is constituted by an upper wall, a lower wall and a circumferential wall having a portion serving as a cathode electrode. The circumferential wall is electrically isolated from the upper and lower walls by means of insulators 413 and it has a portion serving as a cathode electrode 406 which is electrically isolated from the remaining portions by means of insulators 413 as shown in FIG. 4. The cathode electrode 406 is constituted by an electrically conductive material.

The reaction chamber 401 contains a substrate holder 407 provided with an electric heater 403 for heating a substrate 402 (a cylindrical substrate in this case) positioned on the substrate holder, and raw material gas introduction pipes 405 each having a plurality of gas release holes (not shown) for supplying a raw material gas into the reaction chamber and which are connected to the raw material gas supply system (not shown) through a gas inflow valve 409. The substrate 402 is electrically grounded.

Reference numeral 412 indicates a VHF power source capable of supplying a VHF power with 50 to 450 MHz which is electrically coupled to the cathode electrode 406 through a matching box 411. The power VHF power source may be replaced by a RF power source capable of supplying a RF power with 13.56 MHz for example, in the case of forming a photoconductive layer or lower blocking layer.

Reference numeral 415 indicates an exhaust pipe which is open into the reaction chamber 401 and which is connected through a main valve 404 to a vacuum pump 408. The exhaust pipe is provided with a vacuum gage 410 and a vent valve 416.

The substrate holder 407 may be constituted by an electrically conductive material selected from the group constituting of Cu, Al, Au, Ag, Pt, Pb, Ni, Co, Fe, Cr, Mo, Ti, stainless steel, and composite materials of these.

The insulator 413 may comprise an insulating material selected from the group consisting of ceramics, Teflon (trademark name), mica, glass, quartz, silicone rubber, polyethylene, and polypropylene.

The matching box 411 may take any constitution as long as it can adequately match the power source 412 and a load occurred. In this case, it is desired to be made so that the matching can be automatically conducted. Alternatively, it is possible to be made such that the matching is conducted in a manual manner.

The cathode electrode 406 may be constituted by an electrically conductive material selected from the group constituting of Cu, Al, Au, Ag, Pt, Pb, Ni, Co, Fe, Cr, Mo, Ti, stainless steel, and composite materials of these.

If necessary, it is possible for the cathode electrode 406 to be provided with a cooling system. The cooling system in this case may be configured such that to cool the cathode electrode is conducted by means of water, air, liquid nitrogen, or a peltier element.

The shape of the substrate 402 is not limited to the cylindrical shape as shown in FIG. 4 but it may be in a plate-like shape or other appropriate shape depending upon the situation of an electrophotographic light receiving member to be produced.

The substrate 402 may be a substrate shaped in a cylindrical form or other desired form made of an electrically conductive material selected from the group constituting of Cu, Al, Au, Ag, Pt, Pb, Ni, Co, Fe, Cr, Mo, Ti, stainless steel, and composite materials of these. Alternatively, it may comprise an insulating member having a surface coated by an electrically conductive material. The insulating member in this case may be polyester, polyethylene, polycarbonate, cellulose acetate, polypropylene, polyvinyl chloride, polyvinylidene chloride, polystyrene, glass, glass, quartz, ceramics, or paper.

The production of an electrophotographic light receiving member according to the present invention using the plasma CVD apparatus shown in FIG. 4 may be conducted, for example, in the following manner.

A cylindrical substrate 402 having a polished surface is positioned on the substrate holder 407 in the reaction chamber 401 so as to circumscribe the electric heater 403.

By closing the gas inflow valve 409 and opening the main valve 404, the inside of the reaction chamber 401 is evacuated through the exhaust pipe 415 by operating the vacuum pump 408. Thereafter, the gas inflow valve is opened to introduce a heating inert gas (for example, argon gas) into the reaction chamber 401 through the raw material gas introduction pipes 405, where the flow rate of the heating inert gas introduced into the reaction chamber 401 is adjusted so that the inner pressure in the reaction chamber 401 becomes a desired pressure, by properly adjusting the exhaustion speed of the vacuum pump 408. The electric heater 403 is energized while operating a temperature controller (not shown) for the electric heater 403 to heat the substrate 402 to a desired temperature of 20° to 500° C. and the substrate is maintained at this temperature. The gas inflow valve 409 is closed to terminate the introduction of the heating inert gas into the reaction chamber 401. Then, the gas inflow valve 409 and the main valve 404 are opened to evacuate not only the inside of the reaction chamber 401 and but also the inside of the raw material gas supply system including the raw material gas introduction pipes 405. When the reading on the vacuum gage 410 becomes about $5 \times 10^{-6}$ Torr, the gas inflow valve 409 is closed.

Thereafter, film formation is conducted, for example, in a manner as will be described below.

By opening the gas inflow valve 409, a desired silicon-containing raw material gas such as silane gas, disilane gas, methane gas, ethane gas or a gas mixture composed of a desired silicon-containing raw material gas and a doping gas such as diborane or phosphine obtained by means of a mixing panel (not shown) is introduced into the reaction chamber 401 through the raw material gas introduction pipes 405 while adjusting the flow rate of the raw material gas by means of a mass flow controller (not shown). In this case, the opening of the main valve 404 is properly adjusted while observing the reading on the vacuum gage 410 so that the inner pressure (the gas pressure) in the reaction chamber 401 becomes a desired pressure degree of 1 Torr or less. Then, the opening of the main valve 404 is properly adjusted while observing the reading on the vacuum gage 410 so that the inner pressure in the reaction chamber is maintained at a desired pressure degree of several mTorr to several Torr.

By this, the preparation for film formation is completed. Then, the formation of a photoconductive layer on the substrate 402 is conducted as will be described in the following. After confirming that the inner pressure in the reaction chamber is maintained at a desired pressure degree, the power source 412 is switched on to apply a high frequency power with a desired frequency to the cathode electrode 406 through the matching box 411 to cause glow discharge in the reaction chamber 401. In this case, a matching circuit (not shown) contained in the matching box 411 is properly adjusted so that a reflected wave is minimized. Particularly, the value obtained by subtracting a reflected power from an impinged high frequency power is adjusted to a desired value. By this glow discharge caused, the silicon-containing raw material gas introduced into the reaction chamber 401 is decomposed to cause the formation of a silicon-containing deposited film as the photoconductive layer on the substrate 402. After completing the film formation, the power source is switched off, and the introduction of the raw material gas into the reaction chamber 401 is therminated. Then, the inside of the reaction chamber 401 is evacuated to a desired high vacuum degree in the same manner as above described.

Successively, a surface protective layer constituted by a non-single crystalline carbon material (for example, an a-C) is formed on the photoconductive layer, for example, in the following manner.

After the inside of the reaction chamber 401 is evacuated to a desired high vacuum degree as described in the above, a desired hydrocarbon gas such as $CH_4$, $C_2H_6$, $C_3H_8$ or $C_4H_{10}$ and a dilution gas such as $H_2$ gas or He gas are introduced into the reaction chamber 401 through the raw material gas introduction pipes 405 while mixing these gases by means of a mixing panel (not shown) and while properly adjusting their flow rates by means of the corresponding mass flow controllers (not shown). In this case, the opening of the main valve 404 is properly adjusted while observing the reading on the vacuum gage 410 so that the inner pressure (the gas pressure) in the reaction chamber 401 becomes a desired pressure degree of 1 Torr or less. Then, the opening of the main valve 404 is properly adjusted while observing the reading on the vacuum gage 410 so that the inner pressure in the reaction chamber is maintained at a desired pressure degree of several mTorr to several Torr.

After confirming that the inner pressure in the reaction chamber is maintained at a desired pressure degree, the power source 412 is switched on to apply a VHF frequency power with a desired frequency of 50 to 450 MHz to the cathode electrode 406 through the matching box 411 to cause glow discharge in the reaction chamber 401. In this case, the matching circuit (not shown) contained in the matching box 411 is also properly adjusted so that a reflected wave is minimized. Particularly, the value obtained by subtracting a reflected power from an impinged high frequency power is adjusted to a desired value. By this glow discharge caused, the foregoing material gases introduced into the reaction chamber 401 are decomposed to cause the formation of a non-single crystalline carbon (or an a-C) deposited film as the surface protective layer on the photoconductive layer previously formed on the substrate 402. After completing the film formation, the power source is switched off, and the introduction of the foregoing raw material gases into the reaction chamber 401 is terminated. Then, the inside of the reaction chamber 401 is evacuated to a high vacuum degree.

After the inside of the reaction chamber 401 is evacuated to a desired high vacuum degree as described in the above, a desired fluorine-containing gas such as $CF_4$, $C_2F_6$, $CHF_3$, $C_3F_8$, or $C_4F_{10}$ and a dilution gas such as Ar gas, $N_2$ gas or He gas are introduced into the reaction chamber 401 through the raw material gas introduction pipes 405 while mixing these gases by means of a mixing panel (not shown) and while properly adjusting their flow rates by means of the corresponding mass flow controllers (not shown). In this case, the opening of the main valve 404 is properly adjusted while observing the reading on the vacuum gage 410 so that the inner pressure (the gas pressure) in the reaction chamber 401 becomes a desired pressure degree of 1 Torr or less. After confirming that the inner pressure in the reaction chamber 401 is maintained at a desired pressure degree, the power source 412 is switched on to apply a VHF frequency power with a desired frequency of 50 to 450 MHz to the cathode electrode 406 through the matching box 411 to cause glow discharge in the reaction chamber 401. By this glow discharge caused, the fluorine-containing raw material gas introduced into the reaction chamber 401 is decomposed to cause a fluorine-containing plasma, where a surface side layer region of the surface protective layer is etched by the fluorine-containing plasma. In this case, the etching treatment is conducted at an etching speed of 0.1 to 50 Å/sec., and the thickness of the surface protective layer to be etched is adjusted to a value of 20 to 100 Å. After a surface side layer region with a desired thickness of the surface protective layer is etched, the power source 412 is switched off, and the introduction of the foregoing raw material gases is terminated. By this, the etching treatment for the surface protective layer is completed.

In the above, the thickness of the surface protective layer after the etching treatment is made to be in the range of 100 to 10000 Å.

Figure 5:
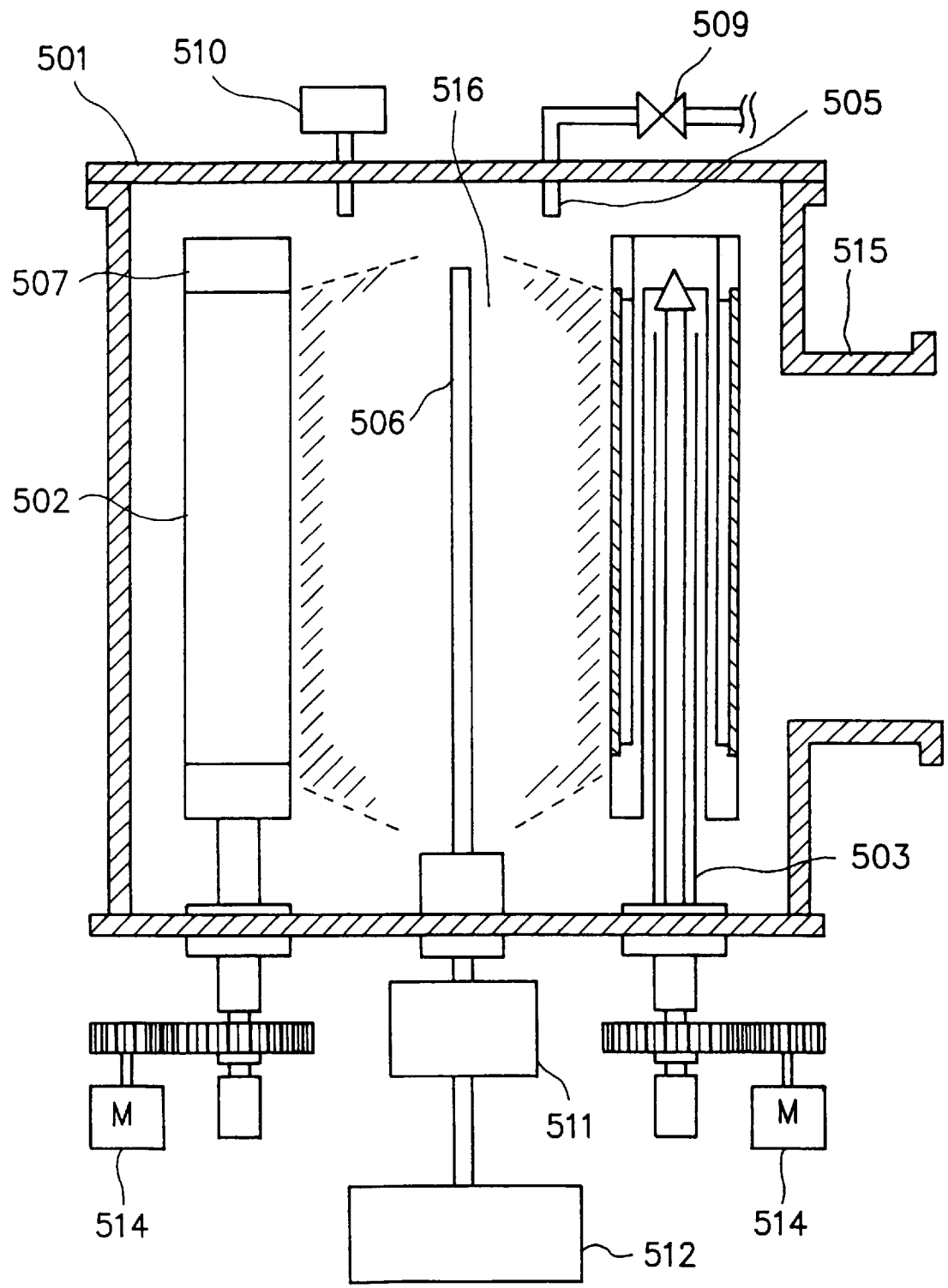
FIG. 5 is a schematic diagram illustrating another film-forming apparatus by a VHF-plasma CVD process for producing an electrophotographic light receiving member.

FIG. 5 is a schematic diagram illustrating another high frequency plasma CVD apparatus suitable for mass-producing an electrophotographic light receiving member according to the present invention.

The plasma CVD apparatus shown in FIG. 5 comprises a reaction chamber 501 (or a deposition chamber) which is connected through a raw material gas introduction pipe 501 having a gas inflow valve 509 to a raw material gas supply system (not shown) containing gas reservoirs (not shown).

The reaction chamber 501 has a structure capable of being vacuumed, and it is provided with an exhaust system containing an exhaust pipe 515 which is open into the reaction chamber and which is connected through a main valve (not shown) to a vacuuming device comprising a diffusion pump (not shown).

In the reaction chamber 501, a plurality of rotatable cylindrical substrate holders 507 (each having an electric heater installed therein for heating a substrate) are spacedly and concentrically arranged so as to circumscribe a discharge space 516. Each ratatable cylindrical substrate holder 507 is supported by a rotary shaft 503 connected to a driving mechanism including a driving motor 514.

Reference numeral 502 indicated a cylindrical substrate positioned on each cylindrical substrate holder 507. Reference numeral 506 indicates an electrode positioned at a central position in the discharge space 516 and which is electrically connected to a high frequency power source 512 through a matching box 511.

Reference numeral 510 indicates a vacuum gage for detecting the inner pressure in the reaction chamber 510.

As the high frequency power surface 512, there can be used a VHF power source capable of supplying a VHF power with a frequency of 50 to 450 MHz in the case of forming a surface protective layer constituted by a non-single crystalline carbon material (for example, an a-C) and also in the case of etching the surface protective layer. In the case of forming other layers such as a photoconductive layer, lower blocking layer, and the like, it may be a D.C. power source or RF power source capable of supplying a RF power with a frequency of 13.56 MHz for example.

The matching box 511 may take any constitution as long as it can adequately match the power source 512 and a load occurred. In this case, it is desired to be made so that the matching can be automatically conducted. Alternatively, it is possible to be made such that the matching is conducted in a manual manner.

The electrode 406 through which a high frequency power is applied may be constituted by an electrically conductive material selected from the group constituting of Cu, Al, Au, Ag, Pt, Pb, Ni, Co, Fe, Cr, Mo, Ti, stainless steel, and composite materials of these. For the shape of the electrode 506, it is desired to be shaped to have a circular cross section. Alternatively, it may be shaped to have a elliptic or polygonal cross section.

If necessary, it is possible for the electrode 506 to be provided with a cooling system. The cooling system in this case may be configured such that to cool the cathode electrode is conducted by means of water, air, liquid nitrogen, or a peltier element.

The shape of the substrate 502 is not limited to the cylindrical shape as shown in FIG. 5 but it may be in a plate-like shape or other appropriate shape depending upon the situation of an electrophotographic light receiving member to be produced.

The substrate 502 may be a substrate shaped in a cylindrical form or other desired form made of an electrically conductive material selected from the group constituting of Cu, Al, Au, Ag, Pt, Pb, Ni, Co, Fe, Cr, Mo, Ti, stainless steel, and composite materials of these. Alternatively, it may comprise an insulating member having a surface coated by an electrically conductive material. The insulating member in this case may be polyester, polyethylene, polycarbonate, cellulose acetate, polypropylene, polyvinyl chloride, polyvinylidene chloride, polystyrene, glass, glass, quartz, ceramics, or paper.

The production of an electrophotographic light receiving member using the plasma CVD apparatus shown in FIG. 5 may be conducted in the same manner as in the case of using the plasma CVD apparatus shown in FIG. 4, except that the position of the electrode (the cathode electrode) is different, and film formation is conducted on the plurality of substrates while rotating these substrates.

In the following, description will be made of an electrophotographic apparatus in which an electrophotographic light receiving member according to the present invention can be desirably used.

Figure 6:
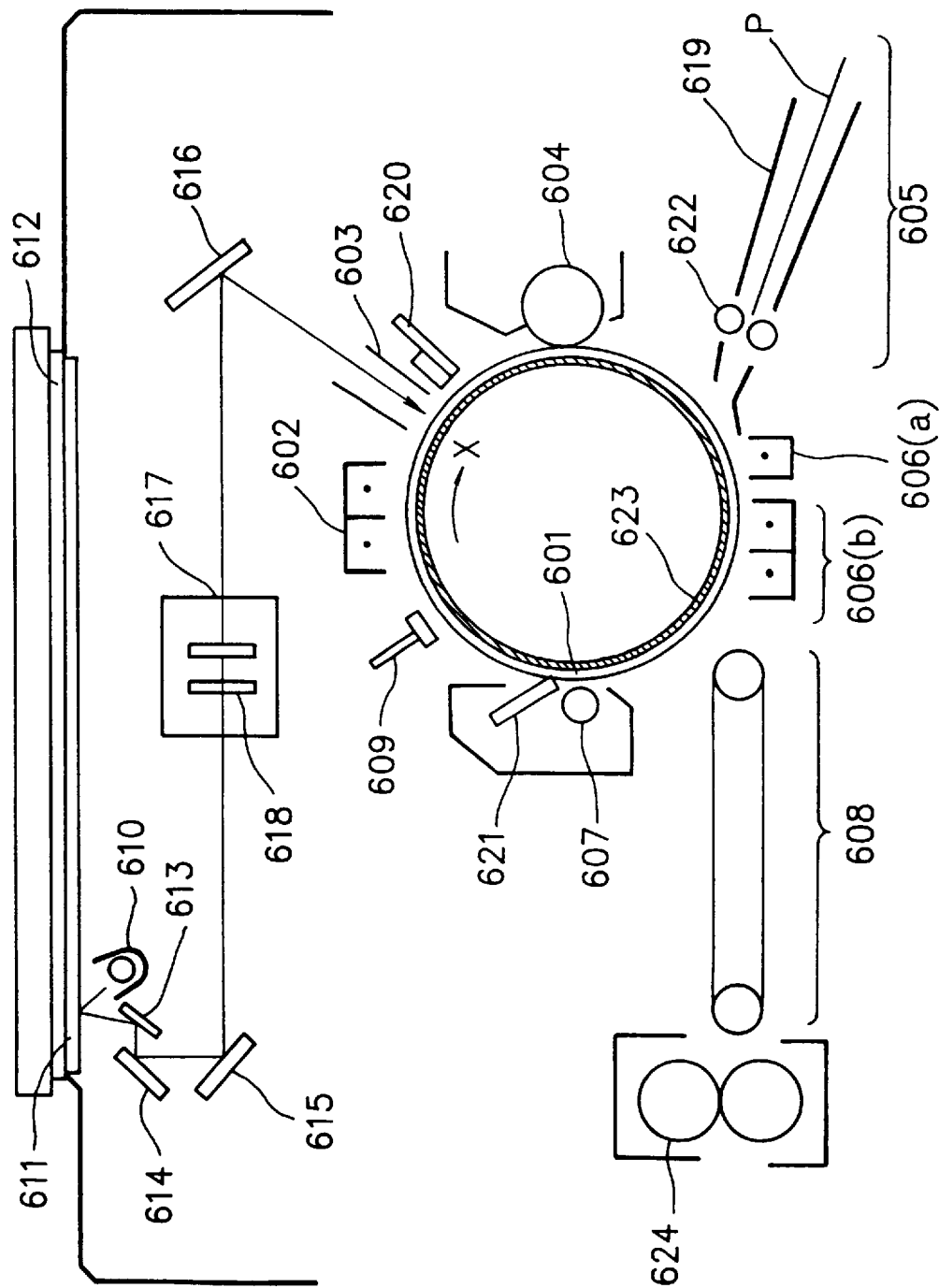
FIG. 6 is a schematic diagram illustrating an example of an electrophotographic apparatus in which an electrophotographic light receiving member according to the present invention can be used.

FIG. 6 is a schematic diagram of illustrating the constitution of an example of an electrophotographic apparatus provided with an electrophotographic light receiving member according to the present invention.

In the electrophotographic apparatus shown in FIG. 6, an electrophotographic light receiving member 601 in a cylindrical form (hereinafter referred to as light receiving member) is controlled to a desired temperature by a heater 623 (a sheet-like shaped heater), and it rotates in the direction indicated by an arrow X. Near the light receiving member 601, there are provided a main corona charger 602, an electrostatic latent image-forming mechanism 603, a development mechanism 604, a transfer sheet feeding mechanism 605, a transfer charger 606($a$), a separating charger 606($b$), a transfer sheet conveying mechanism 608, a cleaning mechanism (comprising a magnet roller 607 and a cleaning blade 621), and a charge-removing lamp 609.

The image-forming process in the electrophotographic apparatus is conducted, for example, as will be described in the following. As above described, the light receiving member 601 is maintained at a predetermined temperature by means of the heater 623. The light receiving member 601 is uniformly charged by the main corona charger 602 to which a voltage of +6 to +8 kV is impressed. Then, an original 612 to be reproduced which is placed on a contact glass 611 is irradiated with light from a light source 610 such as a halogen lamp or fluorescent lamp through the contact glass 611, and the resulting reflected light is projected through mirrors 613, 614 and 615, a lens system 617 containing a filter 618, and a mirror 616 onto the surface of the light receiving member 601 to form an electrostatic latent image corresponding to the original 612 on the surface of the light receiving member 601. The electrostatic latent image formed on the surface of the light receiving member 601 is developed with toner having an negative polarity supplied by the development mechanism 604 to form a toner image on the surface of the light receiving member 601. (Herein, in the case of negative charging, there is used toner having a positive polarity.)

A transfer sheet P is supplied through the transfer sheet feeding mechanism 605 comprising a transfer sheet guide 619 and a pair of feed timing rollers 622 so that the transfer sheet P is brought into contact with the surface of the light receiving member 601, and corona charging is effected with the polarity different to that of the toner from the rear of the transfer sheet P by the transfer charger 606(a) to which a voltage of +7 to +8 kV is impressed, whereby the toner image is transferred onto the transfer sheet P. The transfer sheet P having the toner image transferred thereon is electrostatically removed from the light receiving member 601 by the charge-removing action of the separating charger 606(b) where an A.C. voltage of 12 to 14 kvp-p and with 300 to 600 Hz is impressed, and it is conveyed by the transfer sheet conveying mechanism 608 to a fixing mechanism 624.

The residual toner on the surface of the light receiving member 601 is removed by the magnet roller 607 and the cleaning blade 621 upon arrival at the cleaning mechanism, and the removed toner is stored in a storing box (not shown). Thereafter, the light receiving member 601 thus cleaned is entirely exposed to light by the charge-removing lamp 609 to erase the residual charge and is recycled.

The present invention will be be detailed with reference to examples, which are only for illustrative purposes and are not intended to restrict the scope of the present invention.

EXAMPLE 1

In this example, there was prepared an electrophotographic light receiving member of the constitution shown in FIG. 2 using the plasma CVD apparatus shown in FIG. 4 as will be described below.

(1) Formation of photoconductive layer 203:

There was provided a cylindrical substrate made of aluminum of 108 mm in outer diameter and having a polished surface.

The cylindrical substrate was positioned in the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "lower blocking layer" and "photoconductive layer" of Table 1, on the polished surface of the cylindrical substrate, a 1 μm thick lower blacking layer 206 and a 20 μm thick photoconductive layer 205 were sequentially formed.

(2) Formation of surface protective layer 202:

As the power source 412 of the plasma CVD apparatus shown in FIG. 4, there was used a VHF power source capable of supplying a VHF power with 50 to 450 MHz.

In accordance with the foregoing procedures for forming a surface protective layer using the plasma CVD apparatus shown in FIG. 4 and under film-forming conditions shown in column "surface protective layer" of Table 1, a 0.3 μm (3000 Å) thick surface protective layer 202 was formed on the photoconductive layer 205. In this case, there was used a VHF power with 105 MHz as shown in Table 1.

(3) Surface etching treatment:

In accordance with the foregoing procedures for conducting surface etching treatment for a surface protective layer using the plasma CVD apparatus shown in FIG. 4 and under etching conditions shown in Table 2, the surface protective layer 202 was subjected to etching treatment with a fluorine-containing plasma produced from $CF_4$ by way of plasma discharge with the application of a VHF power (with 105 MHz) of 500 W, where its 300 Å thick surface side layer region was etched at an etching speed of 3 Å/sec. based on a previously established calibration curve. By this, there was obtained an electrophotographic light receiving member.

In this way, there were prepared a plurality of electrophotographic light receiving members.

Evaluation

For the resultant light receiving members, evaluation was conducted with respect to charge retentivity, performance of charge retentivity against temperature change, photosensitivity, residual potential, water repellency, occurrence of smeared image, and halftone reproduction, using an electrophotographic apparatus NP 6060 having the constitution shown in FIG. 6 and which has been modified to be usable for experimental purposes (produced by Canon Kabushiki Kaisha) in the following manner. The evaluated results obtained are collectively shown in Table 6.

(1) Evaluation of the charge retentivity:

The light receiving member is set to the foregoing electrophotographic apparatus, wherein the light receiving member is subjected to corona charging by applying a high voltage of +6 kv where a surface potential in dark is measured by means of the electrostatic voltmeter.

The result obtained is shown in Table 6 on the basis of the following criteria.

⊚: a case wherein the charge retentivity is excellent,

○: a case wherein the charge retentivity is good enough,

Δ: a case wherein the charge retentivity is not so good but is practically acceptable, and X: a case wherein the charge retentivity is apparently inferior and is not acceptable in practice.

(2) Evaluation of the performance of charge retentivity against temperature change:

The light receiving member is set to the foregoing electrophotographic apparatus. In a first step, the light receiving member is maintained at 25° C. and is subjected to corona charging so as to provide a surface potential in dark of 400 V by applying a given high voltage. The high voltage applied in this case is read.

In a second step, the above light receiving member is heated to and maintained at 45° C., then it is subjected to corona charging by applying the high voltage read in the first step, where a surface potential in dark is measured.

The difference between the surface potential in dark of 400 V in the first step and the surface potential in dark obtained in the second step is converted into a factor per 1° C.

Based on the resultant factor, the performance of charge retentivity against temperature change is evaluated.

The result obtained is shown in Table 6 on the basis of the following criteria.

⊚: a case wherein the charge retentivity is substantially not changed and is excellent, ○: a case wherein the charge retentivity is slightly changed but is good enough, Δ: a case where the charge retentivity is fairly changed but is practically acceptable, and X: a case where the charge retentivity is markedly changed and is practically problematic.

(3) Evaluation of the photosensitivity:

The light receiving member is set to the foregoing electrophotographic apparatus, wherein the light receiving member is subjected to corona charging so as to provide a given surface potential in dark, immediately followed by subjecting to irradiation of light from a halogen lamp while excluding light having a wavelength of more than 600 nm by means of a cut-filter wherein the quantity of exposure light is so adjusted that the surface potential in light of the light receiving member becomes to be a given value. The quantity of the exposure light used to obtain said value is reduced from the lighting voltage of the halogen lump. The reduced value obtained is made to be a photosensitivity of the light receiving member.

The result obtained is shown in Table 6 on the basis of the following criteria.

○: a case wherein the photosensitivity is good enough,

Δ: a case wherein the photosensitivity is not so good but is acceptable in practice, and X: a case wherein the photosensitivity is apparently inferior and is practically problematic.

(4) Evaluation of the residual potential:

The light receiving member is set to the foregoing electrophotographic apparatus, wherein the light receiving member is subjected to corona charging so as to provide a surface potential in dark of 400 V, immediately followed by subjecting to irradiation of relatively strong light with 1.5 lux/sec., then followed by subjecting to irradiation of light from a Xenon lamp while excluding light having a wavelength of more than 600 nm by means of a cut-filter wherein the quantity of exposure light, wherein the surface potential in light of the light receiving member is measured by means of a surface potentiometer. Based on the resultant surface potential in light, the residual potential of the light receiving member is evaluated.

The evaluated result obtained is shown in Table 6 on the basis of the following criteria.

○: a case wherein the residual potential is slight and is satisfactory in practice, Δ: a case where the residual potential is relatively large but is practically acceptable, and X: a case wherein the residual potential is remarkable and is practically problematic.

(5) Evaluation of the water repellency:

For the surface of the light receiving member, its water contact angle is measured before and after the endurance by way of continuous copying shot in the evaluation of the occurrence of smeared image which will be described in the following (6), by means of a CA-S-Roll type water contact angle mesuring device (produced by Kyowakaimenkagaku Kabushiki Kaisha) using pure water.

The result obtained is shown in Table 6 on the following criteria.

⊚: a case wherein the water contact angle is excellent,

○: a case wherein the water contact angle is good enough,

Δ: a case wherein the water contact angle is not good but is practically acceptable, and X: a case wherein the water contact angle is apparently inferior and is practically problematic.

(6) Evaluation of the occurrence of smeared image:

The light receiving member is set to the foregoing electrophotographic apparatus, wherein using a teat chart FY9-9058 (produced by CANON Kabushiki Kaisha) containing minute character on the white background as an original, copying shot for an A4-sized paper is continuously conducted 100,000 times under environmental conditions with 30° C./80%RH, followed by exposing the light receiving member to an atmosphere containing ozone generated by applying an electric current of 2000 μA to the main charger by way of negative charging over a period of time corresponding to the duration for continuously conducting 100,000 copying shots without conducting the reproduction of the test chart, then followed by allowing the light receiving member to stand under environmental conditions with 35° C./85%RH for 24 hours. After this, using the above test chart, copying shot for an A3-sized paper is again conducted several times by way of positive charging.

In the above, the light receiving member is always maintained at room temperature without using the heater of the electrophotographic apparatus for the light receiving member.

The copied images obtained in the above are examined of whether or not a defect is present in the reproduction of the minute characters. And one which is worst in terms of the reproduction of the minute characters of the original is dedicated for the evaluation. The evaluated result obtained is shown in Table 6 on the basis of the following criteria.

⊚: a case wherein minute line reproduction is excellent,

○: a case wherein minute line reproduction is good enough,

Δ: a case where a minute line reproduction is not so good but not practically problematic, and X: a case wherein minute line reproduction is apparently inferior and practically problematic.

(7) Evaluation of the halftone reproduction:

The light receiving member is set to the foregoing electrophotographic apparatus, followed by maintaining under environmental conditions with 35° C./85%H for 24 hours, then a halftone test chart FY9-9042 (produced by CANON Kabushiki Kaisha) in which the entire area comprises a halftone image as an original, copying shot for an A3-sized paper is continuously conducted several times under condition that the surface potential in dark of the light receiving member is made to be 400 V by applying a given high voltage to the main charger, the surface potential in light of the light receiving member is made to be 200 V by adjusting the lighting voltage of the halogen lamp, and the heater for the light receiving member is not used.

The copied images obtained are examined of whether or not a defect is present in the reproduction of the halftone image. And one which is worst in terms of the reproduction of the halftone image is dedicated for the evaluation on the basis of the following criteria.

The evaluated result obtained is shown in Table 6.

⊚: a case wherein halftone reproduction is excellent,

○: a case wherein halftone reproduction is good enough,

Δ: a case where halftone reproduction is not so good but not practically problematic, and X: a case wherein halftone reproduction is apparently inferior and practically problematic.

Comparative Example 1

The procedures of Example 1 were repeated, except that the formation of the surface protective layer was conducted using a RF power (with a frequency of 13.56 MHz) of 800 W under film-forming conditions shown in column "surface protective layer" of Table 3 and no surface etching treatment was conducted for the surface protective layer, to thereby obtain a plurality of electrophotographic light receiving member.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 6.

Comparative Example 2

The procedures of Example 1 were repeated, except that the formation of the surface protective layer was conducted using a RF power (with a frequency of 13.56 MHz) of 800 W under film-forming conditions shown in column "surface protective layer" of Table 3 and surface etching treatment was conducted for the surface protective layer using a RF power (with a frequency of 13.56 MHz) of 500 W and at an etching speed of 3 Å/sec. under conditions shown in Table 4 wherein a 300 Å thick surface side layer region of the surface protective layer was etched, to thereby obtain a plurality of electrophotographic light receiving member.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 6.

Comparative Example 3

The procedures of Example 1 were repeated, except that as the surface protective layer, an 0.3 um (3000 Å) thick a-SiC film was formed using a VHF power (with a frequency of MHz) of 200 W under film-forming conditions shown in column "surface protective layer" of Table 5, to thereby obtain a plurality of electrophotographic light receiving member.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 6.

Based on the results shown in Table 6, there are understood such facts as will be described below.

For the light receiving member obtained in Example 1 belonging to the present invention, it excels in charge retentivity, water repellency, prevention of the occurrence of smeared image, and halftone reproduction and is satisfactory in residual potential. In addition, though the reason is uncertain, its photosensitivity is good enough (which means that it is superior to that of the conventional electrophotographic light receiving member).

For the light receiving member obtained in Comparative Example 1 in which the surface protective layer is constituted by the a-C film formed using the RF power with a frequency of 13.56 MHz and which has not been subjected to surface etching treatment and also for the light receiving member obtained in Comparative Example 3 in which the surface protective layer is constituted by the a-SiC film formed using the VHF power with a frequency of 105 MHz and which has not been subjected to surface etching treatment, their halftone reproduction is excellent, their residual potential is good enough, and their charge retentivity and photosensitivity and initial water repellency are acceptable. But they are apparently inferior in water repellency after the endurance by continuous copying shots and also in prevention of the occurrence of smeared image.

For the light receiving member obtained in Comparative Example 2 in which the surface protective layer is constituted by the a-C film formed using the RF power with a frequency of 13.56 MHz and which has been subjected to surface etching treatment using the RF power with a frequency of 13.56 MHz, the initial water repellency and halftone reproduction are excellent, the residual potential is good enough, and the charge retentivity and photosensitivity are acceptable. But it is apparently inferior in water repellency after the endurance by continuous copying shots and also in prevention of the occurrence of smeared image.

EXAMPLE 2

In this example, there were prepared five different electrophotographic light receiving members of the constitution shown in FIG. 2 using the plasma CVD apparatus shown in FIG. 4 as will be described below.

(1) Formation of photoconductive layer 203:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "lower blocking layer" and "photoconductive layer" of Table 1, on the polished surface of the cylindrical substrate a 1 $\mu$m thick lower blocking layer 206 and a 20 $\mu$m thick photoconductive layer 205 were sequentially formed.

(2) Formation of surface protective layer 202:

As the power source 412 of the plasma CVD apparatus shown in FIG. 4, there was used a VHF power source capable of supplying a VHF power with 50 to 450 MHz.

In accordance with the foregoing procedures for forming a surface protective layer using the plasma CVD apparatus shown in FIG. 4 and under film-forming conditions shown in column "surface protective layer" of Table 1, a 0.3 um (3000 Å) thick surface protective layer 202 was formed on the photoconductive layer 205. In this case, there was used a VHF power with 105 MHz as shown in Table 1.

In this way, there were prepared five light receiving members.

(3) Surface etching treatment:

For the surface protective layer 202 of each of the five light receiving members, in accordance with the foregoing procedures for conducting surface etching treatment for a surface protective layer using the plasma CVD apparatus shown in FIG. 4 and under etching conditions shown in Table 7, surface etching treatment was conducted with a fluorine-containing plasma produced from $CF_4$ by way of plasma discharge with the application of a VHF power (with 50 MHz) of a given wattage, where its 500 Å thick surface side layer region was etched at an etching speed of 0.1, 1, 10, 30 or 50 Å/sec. in each case as shown in Table 8 respectively based on a previously established calibration curve, wherein the substrate temperature was maintained at 200° C. as shown in Table 7. By this, there were obtained five different electrophotographic light receiving members.

In this way, there were prepared a plurality of electrophotographic light receiving members in each case.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 8.

Comparative Example 4

In this comparative example, there were prepared two different electrophotographic light receiving members of the constitution shown in FIG. 2 using the plasma CVD apparatus shown in FIG. 4 as will be described below.

(1) Formation of photoconductive layer 203:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "lower blocking layer" and "photoconductive layer" of Table 1, on the polished surface of the cylindrical substrate, a 1 μm thick lower blocking layer 206 and a 20 μm thick photoconductive layer 205 were sequentially formed.

(2) Formation of surface protective layer 202:

As the power source 412 of the plasma CVD apparatus shown in FIG. 4, there was used a VHF power source capable of supplying a VHF power with 50 to 450 MHz.

In accordance with the foregoing procedures for forming a surface protective layer using the plasma CVD apparatus shown in FIG. 4 and under film-forming conditions shown in column "surface protective layer" of Table 1, a 0.3 μm (3000 Å) thick surface protective layer 202 was formed on the photoconductive layer 205. In this case, there was used a VHF power with 105 MHz as shown in Table 1.

In this way, there were prepared two light receiving members.

(3) Surface etching treatment:

For the surface protective layer 202 of each of the two light receiving members, in accordance with the foregoing procedures for conducting surface etching treatment for a surface protective layer using the plasma CVD apparatus shown in FIG. 4 and under etching conditions shown in Table 7, surface etching treatment was conducted with a fluorine-containing plasma produced from $CF_4$ by way of plasma discharge with the application of a VHF power (with 50 MHz) of a given wattage, where its 500 Å thick surface side layer region was etched at an etching speed of 0.05 or 70 Å/sec. in each case as shown in Table 8 respectively based on a previously established calibration curve, wherein the substrate temperature was maintained at 200° C. as shown in Table 7. By this, there were obtained two different electrophotographic light receiving members.

In this way, there were prepared a plurality of electrophotographic light receiving members in each case.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 8.

Based on the results shown in Table 8, there are understood such facts as will be described below.

For the five light receiving members each having a different surface protective layer formed by way of the surface etching treatment at a different etching speed in the range of 0.1 to 50 Å/sec. obtained in Example 2 belonging to the present invention, they excel in charge retentivity, water repellency, prevention of the occurrence of smeared image, and halftone reproduction and are satisfactory in residual potential. In addition, though the reason is uncertain, their photosensitivity is good enough (which means that their photosensitivity is superior to that of the conventional electrophotographic light receiving member).

For one of the two light receiving members obtained in Comparative Example 4 having a surface protective layer formed by way of the surface etching treatment at an etching speed of 0.05 Å/sec., the halftone reproduction is excellent, the photosensitivity and residual potential are good enough, and the charge retentivity and initial water repellency are acceptable. But this light receiving is apparently inferior in water repellency after the endurance by continuous copying shots and also in prevention of the occurrence of smeared image.

For the other light receiving member obtained in Comparative Example 4 having a surface protective layer formed by way of the surface etching treatment at an etching speed of 70 Å/sec., the photosensitivity and residual potential are good enough and the charge retentivity and initial water repellency are acceptable. But this light receiving member is apparently inferior in charge retentivity, water repellency after the endurance by continuous copying shots, and prevention of the occurrence of smeared image, and also in halftone reproduction.

As a result of having examined the surface of the surface protective layer of this light receiving member, the surface of the surface protective layer was found to have a coarse outermost surface state accompanied by porous materials. It is considered that this is a principal reason why the light receiving member is apparently inferior in charge retentivity, water repellency after the endurance by continuous copying shots, prevention of the occurrence of smeared image, and halftone reproduction. In fact, in the endurance by way of continuous copying shots, cleaning defects were occurred, wherein particularly in the evaluation of the halftone reproduction, there were reproduced uneven density halftone images.

EXAMPLE 3

In this example, there were prepared six different electrophotographic light receiving members of the constitution shown in FIG. 2 using the plasma CVD apparatus shown in FIG. 4 as will be described below.

(1) Formation of photoconductive layer 203:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "lower blocking layer" and "photoconductive layer" of Table 1, on the polished surface of the cylindrical substrate, a 1 μm thick lower blocking layer 206 and a 20 μm thick photoconductive layer 205 were sequentially formed.

(2) Formation of surface protective layer 202:

As the power source 412 of the plasma CVD apparatus shown in FIG. 4, there was used a VHF power source capable of supplying a VHF power with 50 to 450 MHz.

In accordance with the foregoing procedures for forming a surface protective layer using the plasma CVD apparatus shown in FIG. 4 and under film-forming conditions shown in column "surface protective layer" of Table 1, a 0.3 μm (3000 Å) thick surface protective layer 202 was formed on the photoconductive layer 205. In this case, there was used a VHF power with 105 MHz as shown in Table 1.

In this way, there were prepared six light receiving members.

(3) Surface etching treatment:

For the surface layer 202 of each of the six light receiving members, in accordance with the foregoing procedures for conducting surface etching treatment for a surface protective layer using the plasma CVD apparatus shown in FIG. 4 and under etching conditions shown in Table 9, surface etching treatment was conducted with a fluorine-containing plasma produced from a different fluorine-containing gas, i.e., $CF_4$, $CHF_3$, $C_2F_6$, $CHClF_2$, $C_3F_8$ or $C_4F_{10}$ as shown in Table 10 by way of plasma discharge with the application of a VHF power (with 105 MHz) of 500 W in each case, where its 500 Å thick surface side layer region was etched at an etching speed of 50 Å/sec. based on a previously established calibration curve, wherein the substrate temperature was maintained at 200° C. as shown in Table 9. By this, there were obtained six different electrophotographic light receiving members.

In this way, there were prepared a plurality of electrophotographic light receiving members in each case.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 10.

EXAMPLE 4

In this example, there were prepared four different electrophotographic light receiving members of the constitution shown in FIG. 3 using the plasma CVD apparatus shown in FIG. 4 as will be described below.

(1) Formation of photoconductive layer 303:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "charge transportation layer" and "charge generation layer" of Table 11, on the polished surface of the cylindrical substrate, a 15 μm charge transportation layer 306 and a 5 μm thick charge generation layer 305 were sequentially formed.

In this way, there were prepared four light receiving members in process.

(2) Formation of surface protective layer 302:

As the power source 412 of the plasma CVD apparatus shown in FIG. 4, there was used a VHF power source capable of supplying a VHF power with 50 to 450 MHz.

For each of the four light receiving members in process obtained in the above step (1), in accordance with the foregoing procedures for forming a surface protective layer using the plasma CVD apparatus shown in FIG. 4 and under film-forming conditions shown in column "surface protective layer" of Table 11, a 0.3 μm (3000 Å) thick surface protective layer 302 (comprising an a-C film) was formed on the charge generation layer 305 using a VHF power with a different frequency of 50 MHz, 105 MHz, 300 MHz, or 450 MHz and of 1000 W as shown in Tables 11 and 14 under condition of 50 mTorr for the inner pressure.

By this, there were obtained four different light receiving members each having a different surface protective layer.

(3) Surface etching treatment:

For the surface protective layer 302 of each of the resultant four light receiving members, in accordance with the foregoing procedures for conducting surface etching treatment for a surface protective layer using the plasma CVD apparatus shown in FIG. 4 and under etching conditions shown in Table 12, surface etching treatment was conducted with a fluorine-containing plasma produced from $C_2F_6$ by way of plasma discharge with the application of a VHF power (with 60 MHz) of 500 W, where its 500 Å thick surface side layer region was etched at an different etching speed of 1 Å/sec., 5 Å/sec., 8 Å/sec. or 10 Å/sec. respectively based on a previously established calibration curve, wherein the substrate temperature was maintained at 200° C. as shown in Table 12. By this, there were obtained four different electrophotographic light receiving members.

In this way, there were prepared a plurality of electrophotographic light receiving members in each case.

For the resultant light receiving members, evaluation was conducted with respect to charge retentivity, performance of charge retentivity against temperature change, photosensitivity, residual potential, water repellency, occurence of smeared image, and halftone reproduction in the same manner as in Example 1.

The evaluated results obtained are collectively shown in Table 14.

Comparative Example 5

In this example, there was prepared an electrophotographic light receiving member of the constitution shown in FIG. 3 using the plasma CVD apparatus shown in FIG. 4 as will be described below.

(1) Formation of photoconductive layer 303:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "charge transportation layer" and "charge generation layer" of Table 11, on the polished surface of the cylindrical substrate, a 15 µm charge transportation layer 306 and a 5 µm thick charge generation layer 305 were sequentially formed.

(2) Formation of surface protective layer 302

In the same film-forming manner as in the case of the above step (1) using a RF power with 13.56 MHz except for changing the film-forming conditions to those shown in column "surface protective layer" of Table 11, there was formed a 0.3 µm (3000 Å) thick surface protective layer (comprising an a-C film) on the charge generation layer 305 using a RF power (with 13.56 MHz) of 1000 W under condition of 0.5 Torr for the inner pressure.

(3) Surface etching treatment:

For the surface protective layer 302 of the resultant light receiving member, surface etching treatment was conducted in the same manner as in Example 4 under condition of 5 Å/sec. for the etching speed, where its 500 Å thick surface side layer region was etched. By this, there was obtained an electrophotographic light receiving member.

In this way, there were prepared a plurality of electrophotographic light receiving members.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 14.

Comparative Example 6

In this example, there were prepared an electrophotographic light receiving member of the constitution shown in FIG. 3 using the plasma CVD apparatus shown in FIG. 4 as will be described below.

(1) Formation of photoconductive layer 303:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "charge transportation layer" and "charge generation layer" of Table 11, on the polished surface of the cylindrical substrate, a 15 µm charge transportation layer 306 and a 5 µm thick charge generation layer 305 were sequentially formed.

(2) Formation of surface protective layer 302:

As the power source 412 of the plasma CVD apparatus shown in FIG. 4, there was used a power source capable of supplying a power with 500 MHz.

In accordance with the foregoing procedures for forming a surface protective layer using the plasma CVD apparatus shown in FIG. 4 and under film-forming conditions shown in column "surface protective layer" of Table 11, a 0.3 µm (3000 Å) thick surface protective layer 302 (comprising an a-C film) was formed on the charge generation layer 305 using a power with 500 MHz and of 1000 W under condition of 50 mTorr for the inner pressure.

By this, there was obtained an light receiving member.

(3) Surface etching treatment:

For the surface protective layer 302 of the resultant light receiving member, surface etching treatment was conducted in the same manner as in Example 4 under condition of 3 Å/sec. for the etching speed. By this, there was obtained an electrophotographic light receiving member.

In this way, there were prepared a plurality of electrophotographic light receiving members.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 14.

Comparative Example 7

Figure 7:
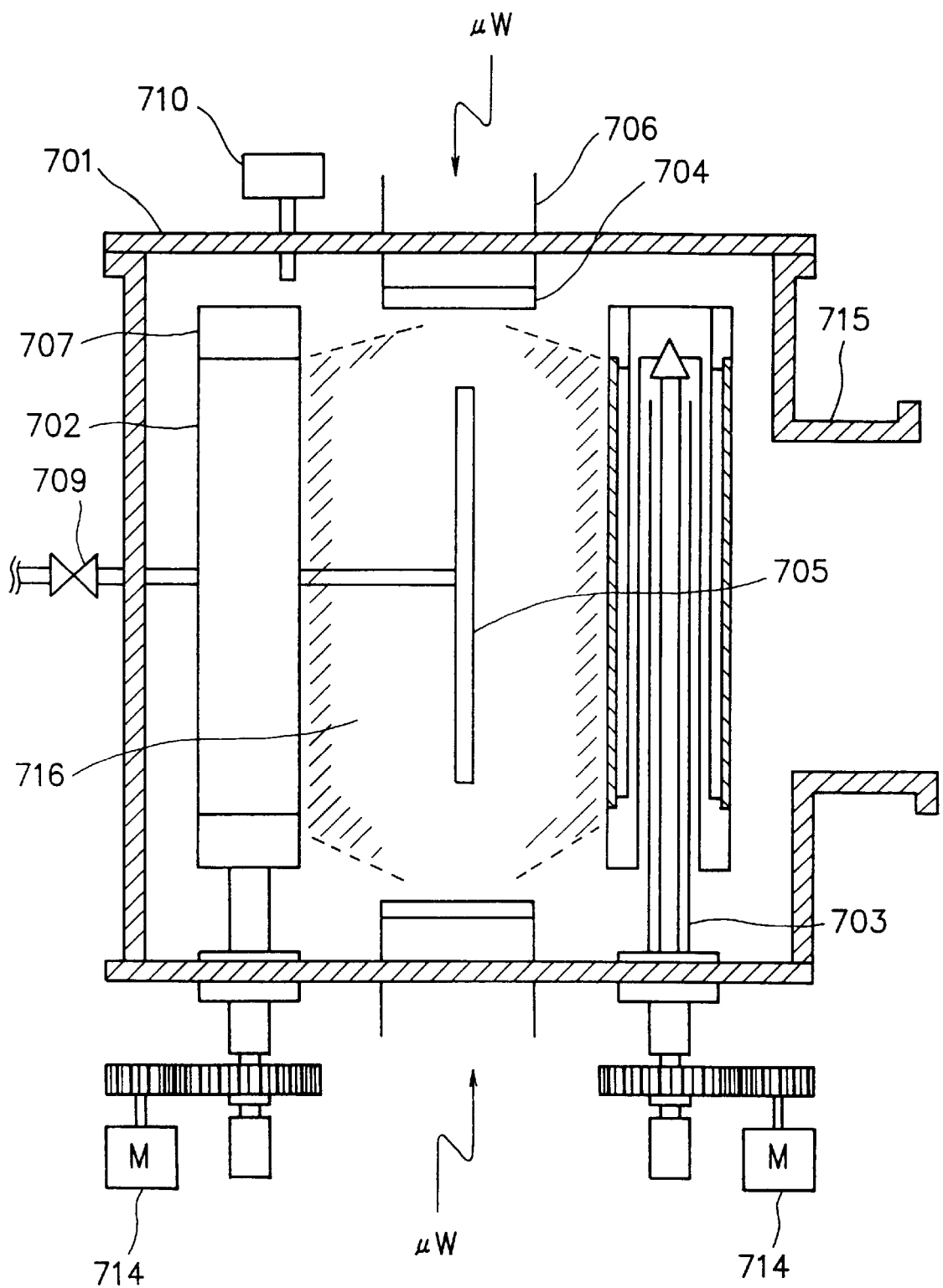
FIG. 7 is a schematic diagram illustrating another film-forming apparatus by a microwave plasma CVD process for producing an electrophotographic light receiving member.

In this example, there was prepared an electrophotographic light receiving members of the constitution shown in FIG. 3 using the microwave plasma CVD apparatus shown in FIG. 7.

Herein, description will be made of the microwave plasma CVD apparatus shown in FIG. 7.

The microwave plasma CVD apparatus comprises a reaction chamber 701 (or a deposition chamber) having a structure capable of being vacuumed, and it is provided with an exhaust system containing an exhaust pipe 725 which is open into the reaction chamber 701 and which is connected through a main valve (not shown) to a vacuuming device comprising a diffusion pump (not shown).

The reaction chamber 701 is hermetically provided with a microwave introduction window 704 made of a microwave transmissive material to which a waveguide 706 extending from a microwave power source (not shown) through a stub tuner (not shown) and an isolator (not shown) is connected.

In the reaction chamber 701, a plurality of rotatable cylindrical substrate holders 707 (each having an electric heater installed therein for heating a substrate) are spacedly and concentrically arranged so as to circumscribe a discharge space 716. Each rotatable cylindrical substrate holder 707 is supported by a rotary shaft 703 connected to a driving mechanism including a driving motor 714.

Reference numeral 702 indicates a cylindrical substrate positioned on each cylindrical substrate holder 707.

Reference numeral 705 indicates a raw material gas introduction pipe proved with a plurality of gas release holes positioned in the discharge space 716 and which is connected through a conduit provided with a gas inflow valve 709 to a raw material gas supply system containing gas reservoirs (not shown).

Reference numeral 710 indicates a vacuum gage for detecting the inner pressure in the reaction chamber 701.

Film formation using this microwave plasma CVD apparatus may be conducted in the same manner as that in the case of using the plasma CVD apparatus shown in FIG. 4, except that the position for a substrate to be arranged is different; as the power for the decomposition, a microwave power (with 2.45 GHz) is used; and the manner for introducing the power into the reaction chamber is different.

Now, the preparation of the electrophotographic light receiving member was conducted in the following manner.

There were provided a plurality of cylindrical substrate 702 made of aluminum of 108 mm in outer diameter and having a polished surface.

Each cylindrical substrate 702 was positioned on one of the substrate holders 707 of the microwave plasma CVD apparatus shown in FIG. 7.

Under film-forming conditions shown in Table 13, there were sequentially formed a 15 μm thick charge transportation layer 306, a 5 μm thick charge generation layer 305 and a 0.5 μm (5000 Å) thick surface protective layer 302 on each substrate 707.

By this, there were obtained a plurality of light receiving members.

The resultant light receiving members were set to the plasma CVD apparatus shown in FIG. 5, wherein for the surface protective layer 302 of each light receiving members, in accordance with the foregoing procedures for conducting surface etching treatment for a surface protective layer using the plasma CVD apparatus shown in FIG. 4 and under etching conditions shown in Table 12, surface etching treatment was conducted with a fluorine-containing plasma produced from $C_2F_6$ by way of plasma discharge with the application of a VHF power (with 60 MHz) of 500 W, where its 500 Å thick surface side layer region was etched at an etching speed of 4 Å/sec. based on a previously established calibration curve, wherein the substrate temperature was maintained at 200° C. as shown in Table 12. By this, there were obtained a plurality of electrophotographic light receiving members.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 14.

Based on the results shown in Table 14, there are understood such facts as will be described in the following.

By forming the surface protective layer for an electrophotographic light receiving member using a VHF power with a frequency in the range of 50 to 450 MHz and conducting surface etching treatment for the surface protective layer using a VHF power with a frequency in the range of 50 to 450 MHz, there can be effectively attained the production of a desirable electrophotographic light receiving member having excellent electrophotographic characteristics.

EXAMPLE 5

In this example, there were prepared seven different electrophotographic light receiving members of the constitution shown in FIG. 2 using the plasma CVD apparatus shown in FIG. 4 as will be described below.

(1) Formation of photoconductive layer 203:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "lower blocking layer" and "photoconductive layer" of Table 15, on the polished surface of the cylindrical substrate, a 2 μm thick lower blocking layer 206 and a 30 μm thick photoconductive layer 205 were sequentially formed.

In this way, there were prepared seven light receiving members in process.

(2) Formation of surface protective layer 202:

As the power source 412 of the plasma CVD apparatus shown in FIG. 4, there was used a VHF power source capable of supplying a VHF power with 50 to 450 MHz.

On the photoconductive layer 205 of each of the resultant seven light receiving members in process, in accordance with the foregoing procedures for forming a surface protective layer using the plasma CVD apparatus shown in FIG. 4 and under film-forming conditions shown in column "surface protective layer" of Table 15 and at a different inner pressure of 1 mTorr, 5 mTorr, 10 mTorr, 30 mTorr, 50 mTorr, 70 mTorr, or 100 mTorr (see, Table 17), there was formed a 0.6 μm (6000 Å) thick surface protective layer 202. By this, there were obtained seven different light receiving members. Then, the temperature each of these light receiving members was cooled to 30° C.

(3) Surface etching treatment:

For the surface protective layer 202 of the resultant seven light receiving members, surface etching treatment was conducted in the following manner.

In accordance with the foregoing procedures for conducting surface etching treatment for a surface protective layer using the plasma CVD apparatus shown in FIG. 4 and under etching conditions shown in Table 16, the surface protective layer 202 was subjected to etching treatment with a fluorine-containing plasma produced from $CF_4$ by way of plasma discharge with the application of a VHF power (with 105 MHz) of 500 W, where its 1000 Å thick surface side layer region was etched at a etching speed of 8 Å/sec. based on a previously established calibration curve. By this, there were obtained seven different electrophotographic light receiving members each having a different surface protective layer.

In this way, there were prepared a plurality of electrophotographic light receiving members in each case.

For the resultant light receiving members, evaluation was conducted with respect to charge retentivity, performance of charge retentivity against temperature change, photosensitivity, residual potential, water repellency, occurrence of smeared image, and halftone preproduction in the same manner as in Example 1.

The evaluated results obtained are collectively shown in Table 17.

Based on the results shown in Table 17, there are understood such facts as will be described in the following. The advantages of the present invention can be attained by adopting an adequate inner pressure upon the formation of a surface protective layer for an electrophotographic light receiving member. And particularly, in the case of adopting

37 an inner pressure of 50 mTorr or less, the advantages of the present invention are significant.

Example 6

In this example, there were prepared five different electrophotographic light receiving members of the constitution shown in FIG. 2 using the plasma CVD apparatus shown in FIG. 4 as will be described below.

(1) Formation of photoconductive layer 203:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "lower blocking layer" and "photoconductive layer" of Table 18, on the polished surface of the cylindrical substrate, a 1 μm thick lower blocking layer 206 and a 20 μm thick photoconductive layer 205 were sequentially formed.

In this way, there were prepared five light receiving members in process.

(2) Formation of surface protective layer 202:

As the power source 412 of the plasma CVD apparatus shown in FIG. 4 there was used a VHF power source capable of supplying a VHF power with 50 to 450 MHz.

On the photoconductive layer 205 of each of the resultant five light receiving members in process, in accordance with the foregoing procedures for forming a surface protective layer using the plasma CVD apparatus shown in FIG. 4 and under film-forming conditions shown in column "surface protective layer" of Table 18, there was formed a surface protective layer 202 having a different thickness of 0.012 μm (120 Å), 0.11 μm (1100 Å), 0.4 μm (4000 Å), 0.8 μm (8000 Å), or 1.5 μm (15000 Å) in each case. By this, there were obtained five different light receiving members.

(3) Surface etching treatment:

For the surface protective layer 202 of the resultant five light receiving members, surface etching treatment was conducted in the following manner.

In accordance with the foregoing procedures for conducting surface etching treatment for a surface protective layer using the plasma CVD apparatus shown in FIG. 4 and under etching conditions shown in Table 19, the surface protective layer 202 was subjected to etching treatment with a fluorine-containing plasma produced from $CF_4$ by way of plasma discharge with the application of a VHF power (with 80 MHz) of 200 W, where a surface side layer region wit a different thickness of 20 Å, 100 Å, 1000 Å, 3000 Å, or 5000 Å was etched at an etching speed of 1 Å/sec. based on a previously established calibration curve in each case. By this, there were obtained five different electrophotographic light receiving members each having a surface protective layer with a different thickness of 100 Å, 1000 Å, 3000 Å, 5000 Å, or 10000 Å (see, Table 20).

In this way, there were prepared a plurality of electrophotographic light receiving members in each case.

For the resultant light receiving members, evaluation was conducted with respect to charge retentivity, performance of charge retentivity against temperature change, photosensitivity, residual potential, water repellency, occur-

38 rence of smeared image, and halftone reproduction in the same manner as in Example 1.

The evaluated results obtained are collectively shown in Table 20.

Comparative Example 8

In this example, there were prepared two different electrophotographic light receiving members of the constitution shown in FIG. 2 using the plasma CVD apparatus shown in FIG. 4 as will be described below.

(1) Formation of photoconductive layer 203:

There was provided a cylindrical substrate made of aluminum of 108 mm in outer diameter and having a polished surface.

The cylindrical substrate was positioned on the substrate holder 407 of the plasma CVD apparatus shown in FIG. 4. As the power source 412, there was used a RF power source capable of supplying a RF power with 13.56 MHz.

In accordance with the foregoing procedures for forming a photoconductive layer using the plasma CVD apparatus shown in FIG. 4 and under film-forming conditions shown in columns "lower blocking layer" and "photoconductive layer" of Table 18, on the polished surface of the cylindrical substrate, a 1 μm thick lower blocking layer 206 and a 20 μm thick photoconductive layer 205 were sequentially formed.

In this way, there were prepared two light receiving members in process.

(2) Formation of surface protective layer 202:

As the power source 412 of the plasma CVD apparatus shown in FIG. 4, there was used a VHF power source capable of supplying a VHF power with 50 to 450 MHz.

On the photoconductive layer 205 of each of the resultant two light receiving members in process, in accordance with the foregoing procedures for forming a surface protective layer using the plasma CVD apparatus shown in FIG. 4 and under film-forming conditions shown in column "surface protective layer" of Table 18, there was formed a surface protective layer 202 having a different thickness of 0.01 μm (100 Å), or 1.15 μm (11500 Å) in each case. By this, there were obtained two different light receiving members.

(3) Surface etching treatment:

For the surface protective layer 202 of the resultant two light receiving members, surface etching treatment was conducted in the following manner.

In accordance with the foregoing procedures for conducting surface etching treatment for a surface protective layer using the plasma CVD apparatus shown in FIG. 4 and under etching conditions shown in Table 19, the surface protective layer 202 was subjected to etching treatment with a fluorine-containing plasma produced from $CF_4$ by way of plasma discharge with the application of a VHF power (with 80 MHz) of 200 W, where a surface side layer region with a different thickness of 50 Å, or 500 Å was etched at an etching speed of 1 Å/sec. based on a previously established calibration curve in each case. By this, there were obtained two different electrophotographic light receiving members each having a surface protective layer with a different thickness of 50 Å, or 11000 Å (see, Table 20).

In this way, there were prepared a plurality of electrophotographic light receiving members in each case.

For the resultant light receiving members, evaluation was conducted with respect to charge retentivity, performance of charge retentivity against temperature change, photosensitivity, residual potential, water repellency, occurrence of smeared image, and halftone reproduction in the same manner as in Example 1.

The evaluated results obtained are collectively shown in Table 20.

Based on the results shown in Table 20, there are understood such facts as will be described in the following. Any of the electrophotographic light receiving members obtained in Example 6 (belonging to the present invention) in which the surface protective layer comprises an non-single crystalline carbon material layer with a thickness of 100 to 10000 Å formed by subjecting a non-single crystalline carbon film (for example, an a-C) formed using a VHF power to surface etching treatment with a fluorine-containing plasma produced using a VHF power is excellent in water repellency, prevention of the occurrence of smeared image, and halftone reproduction, and is excellent, good enough or satisfactory in charge retentivity, photosensitivity, and residual potential.

On the other hand, for the two electrophotographic light receiving member obtained in Comparative Example 8, one in which the surface protective layer (formed in the same manner as in Example 6) is 50 Å in thickness is inferior to any of the electrophotographic light receiving members particularly in terms of the charge retentivity. And the other one in which the surface protective layer (formed in the same manner as in Example 6) is 11000 Å in thickness is markedly inferior to any of the electrophotographic light receiving members particularly in terms of the photosensitivity.

Separately, for each of the electrophotographic light receiving members obtained in Example 6 and Comparative Example 8, forced jamming test was conducted, followed by subjecting to halftone image reproduction in the same manner as in the case of the evaluation of the halftone reproduction described in Example 1.

As a result, only in the case of the electrophotographic light receiving member in which the surface protective layer is 50 Å in thickness, a certain defect was occurred at the outermost surface thereof in the forced jamming test, and a halftone image reproduced in the halftone image reproduction was found to have a defective halftone image based on said defect occurred at the outermost surface of the electrophotographic light receiving member.

The remaining electrophotographic light receiving members were free of such problems.

Example 9

The procedures of Example 1 were repeated, except that the plasma CVD of FIG. 4 apparatus used in Example 1 was replaced by the plasma CVD apparatus shown in FIG. 5, to produce a plurality of electrophotographic light receiving members of the constitution shown in FIG. 2 at the same time.

The resultant electrophotographic light receiving members were evaluated in the same manner as in Example 1.

As a result, these electrophotographic light receiving members were found to have excellent electrophotographic characteristics as well as in Example 1.

In this respect, it is understood that an electrophotographic light receiving member having excellent eletrophotographic characteristics according to the present invention can be effectively mass-produced in an quantity production type plasma CVD apparatus according to the present invention.

Example 10 and Comparative Example 9

For each of the electrophpotographic light receiving members obtained in Example 1 and Comparative Examples 1 to 3, examination was conducted of the fluorine atoms deposited in the outermost surface of the surface protective layer before and after the endurance by way of continuous copying shots by means of XPS analysis.

As a result, for the electrophotographic light receiving member obtained in Example 1, it was found that the fluorine atoms contained in the outermost surface of the surface protective layer before the endurance are still remained at a survival rate of more than 80% in a desirable state therein even after the endurance.

For each of the electrophpotographic light receiving members obtained in Comparative Examples 1 to 3, it was found that the fluorine atoms contained in the outermost surface of the surface protective layer before the endurance are remained merely at a survival rate of less than 10% therein even after the endurance.

These facts indicate that only in the case of subjecting a non-single crystalline carbon film (such as an a-C film) formed using a VHF power with an oscillation frequency of 50 to 450 MHz to surface etching treatment with a fluorine-containing plasma produced using a VHF power with an oscillation frequency of 50 to 450 MHz, there can be attained an excellent electrophotographic light receiving member having an improved surface protective layer with an excellent outermost surface deposited fluorine atoms so as to cover substantially the entire of the outermost surface in a state that the fluorine atoms are hardly removed, and which exhibits a markedly improved durability when used under high temperature and high humidity environmental conditions.

As apparent from the above description, according to the present invention, by forming, on a photoconductive layer formed on a desired substrate, a surface protective layer composed of a non-single crystalline carbon material containing hydrogen atoms by decomposing a raw material gas comprising at least a hydrocarbon using a VHF power with an oscillation frequency of 50 to 450 MHz, and subjecting a surface side layer region with a given thickness of said surface protective layer to etching treatment with a fluorine-containing plasma produced by way of plasma discharge with the application of a VHF power with an oscillation frequency of 50 to 450 MHz in a fluorine-containing raw material gas at an etching speed of 0.1 to 50 Å/sec. so that the surface protective layer has a thickness of 100 to 10000 Å, there can be effectively attained an improved electrophotographic light receiving member which is free of the deposition of the foregoing discharge products caused upon corona discharging found in the prior art, which always reproduces a high quality image with neither an unfocused image nor a smeared image under any environmental conditions without using the heating means for an electrophotographic light receiving member as in the prior art, which always reproduces a high quality halftone image with no density unevenness from a halftone original even after having been paused over a long period of time, which is sufficient enough in charge retentability and high enough in photosensitivity, and which always reproduces a highly dense and clear image.

It should be understood that the present invention is not limited to the foregoing layer constitution and the foregoing fabrication apparatus, and it can be optionally modified within a range of the principle of the present invention.

TABLE 1 lower blocking layer

| | | |
|---|---|---|
| SiH$_4$ | 300 | sccm |
| H$_2$ | 500 | sccm |
| NO | 8 | sccm |
| B$_2$H$_6$ | 2000 | ppm |
| power | 100 | W (13.56 MHz) |
| inner pressure | 0.4 | Torr |
| substate temperature | 250° | C. |
| layer thickness | 1 | μm | photocunductive layer

| | | |
|---|---|---|
| SiH$_4$ | 500 | sccm |
| H$_2$ | 500 | sccm |
| power | 400 | W (13.56 MHz) |
| inner pressure | 0.5 | Torr |
| substate temperature | 250° | C. |
| layer thickness | 20 | μm | surface protective layer

| | | |
|---|---|---|
| CH$_4$ | 500 | sccm |
| power | 800 | W (105 MHz) |
| inner pressure | 20 | mTorr |
| substate temperature | 250° | C. |
| layer thickness | 0.3 | μm (3000 Å) |

TABLE 2

| | | |
|---|---|---|
| CF$_4$ | 500 | sccm |
| substrate temperature | 250° | C. |
| inner pressure | 20 | mTorr |
| power | 500 | W (105 MHz) |

TABLE 3 lower blocking layer

| | | |
|---|---|---|
| SiH$_4$ | 300 | sccm |
| H$_2$ | 500 | sccm |
| NO | 8 | sccm |
| B$_2$H$_6$ | 2000 | ppm |
| power | 100 | W (13.56 MHz) |
| inner pressure | 0.4 | Torr |
| substate temperature | 250° | C. |
| layer thickness | 1 | μm | photocunductive layer

| | | |
|---|---|---|
| SiH$_4$ | 500 | sccm |
| H$_2$ | 500 | sccm |
| power | 400 | W (13.56 MHz) |
| inner pressure | 0.5 | Torr |
| substate temperature | 250° | C. |
| layer thickness | 20 | μm |

TABLE 3-continued surface protective layer

| | | |
|---|---|---|
| CH$_4$ | 500 | sccm |
| power | 800 | W (13.56 MHz) |
| inner pressure | 0.5 | mTorr |
| substrate temperature | 250° | C. |
| layer thickness | 0.3 | μm (3000 Å) |

TABLE 4

| | | |
|---|---|---|
| CF$_4$ | 500 | sccm |
| substrate temperature | 250° | C. |
| inner pressure | 0.5 | mTorr |
| power | 500 | W (13.56 MHz) |

TABLE 5 lower blocking layer

| | | |
|---|---|---|
| SiH$_4$ | 300 | sccm |
| H$_2$ | 500 | sccm |
| NO | 8 | sccm |
| B$_2$H$_6$ | 2000 | ppm |
| power | 100 | W (13.56 MHz) |
| inner pressure | 0.4 | Torr |
| substrate temperature | 250° | C. |
| layer thickness | 1 | μm | photocunductive layer

| | | |
|---|---|---|
| SiH$_4$ | 500 | sccm |
| H$_2$ | 500 | sccm |
| power | 400 | W (13.56 MHz) |
| inner pressure | 0.5 | Torr |
| substrate temperature | 250° | C. |
| layer thickness | 20 | μm | surface protective layer

| | | |
|---|---|---|
| SiH$_4$ | 50 | sccm |
| CH$_4$ | 500 | sccm |
| power | 200 | W (105 MHz) |
| inner pressure | 20 | mTorr |
| substrate temperature | 250° | C. |
| layer thickness | 0.3 | μm (3000 Å) |

TABLE 6

| | Example 1 | Comparative Example 1 | Comparative Example 2 | Comparative Example 3 |
|---|---|---|---|---|
| surface protective layer | a-C film formed with VHF | a-C film formed with RF | a-C film formed with RF | a-C film formed with VHF |
| etching | VHF | none | Rf | none |
| charge retentivity | ⊙ | Δ | Δ | Δ |
| performance of charge retentivity against temperature change | ⊙ | Δ | Δ | Δ |
| photosensitivity | ◯ | Δ | Δ | Δ |
| residual potential | ◯ | ◯ | ◯ | ◯ |
| water repellency | ⊙ | Δ | ⊙ | Δ |

TABLE 6-continued

|  | Example 1 | Comparative Example 1 | Comparative Example 2 | Comparative Example 3 |
|---|---|---|---|---|
| water repellency (before durability test) | ⊚ | × | × | × |
| water repellency (after durability test) | ⊚ | × | × | × |
| occurrence of smeared image | ⊚ | × | × | × |
| halftone reproduction | ⊚ | ⊚ | ⊚ | ⊚ |

TABLE 7

| $CF_4$ | 800 sccm |
|---|---|
| substrate temperature | 200° C. |
| inner pressure | 20 mTorr |
| power (wattage) | changed in each case for the VHF power with 50 MHz |

TABLE 8

|  | Example 2 |  |  |  |  | Comparative Example 4 |  |
|---|---|---|---|---|---|---|---|
| etching speed (Å/sec) | 0.1 | 1 | 10 | 30 | 50 | 0.05 | 70 |
| charge retentivity | ○ | ⊚ | ⊚ | ⊚ | ○ | Δ | × |
| performance of charge retentivity against temperature change | ○ | ⊚ | ⊚ | ⊚ | ○ | Δ | Δ |
| photosensitivity | ○ | ○ | ○ | ○ | ○ | ○ | ○ |
| residual potential | ○ | ○ | ○ | ○ | ○ | ○ | ○ |
| water repellency (before durability test) | ○ | ⊚ | ⊚ | ⊚ | ○ | Δ | Δ |
| water repellency (after durability test) | ○ | ⊚ | ⊚ | ⊚ | ○ | × | × |
| occurrence of smeared image | ○ | ⊚ | ⊚ | ⊚ | ○ | × | × |
| halftone reproduction | ⊚ | ⊚ | ⊚ | ⊚ | ⊚ | ⊚ | × |

TABLE 9

| gases used | 500 sccm |
|---|---|
| substrate temperature | 200° C. |
| inner pressure | 10 mTorr |
| power | 500 W (105 MHz) |

TABLE 10

|  | Example 3 |  |  |  |  |  |
|---|---|---|---|---|---|---|
| etching gas used | $CF_4$ | $CHF_3$ | $C_2F_6$ | $CHClF_2$ | $C_3F_6$ | $C_4H_{10}$ |
| charge retentivity | ⊚ | ⊚ | ⊚ | ○ | ⊚ | ⊚ |
| performance of charge retentivity against temperature change | ⊚ | ⊚ | ⊚ | ○ | ⊚ | ⊚ |
| photosensitivity | ○ | ○ | ○ | ○ | ○ | ○ |
| residual potential | ○ | ○ | ○ | ○ | ○ | ○ |
| water repellency (before durability test) | ⊚ | ⊚ | ⊚ | ⊚ | ⊚ | ⊚ |
| water repellency (after durability test) | ⊚ | ⊚ | ⊚ | ⊚ | ⊚ | ⊚ |
| occurrence of smeared image | ⊚ | ⊚ | ⊚ | ⊚ | ⊚ | ⊚ |
| halftone reproduction | ⊚ | ⊚ | ⊚ | ⊚ | ⊚ | ⊚ |

TABLE 11

| charge transportation layer | |
|---|---|
| $SiH_4$ | 500 sccm |
| $H_2$ | 500 sccm |
| $CH_4$ | 50 sccm |
| power | 300 W (13.56 MHz) |
| inner pressure | 20 mTorr |
| substrate temperature | 200° C. |
| layer thickness | 15 μm |
| charge generation layer | |
| $SiH_4$ | 500 sccm |
| $H_2$ | 500 sccm |
| power | 300 W (13.56 MHz) |
| inner pressure | 20 mTorr |
| substrate temperature | 200° C. |
| layer thickness | 5 μm |
| surface protective layer | |
| $CH_4$ | 100 sccm |
| power | 1000 W (13.56 MHz. 50~450 MHz, 500 MHz) |
| inner pressure | 50 mTorr (50~450 MHz, 500 MHz) |
| inner pressure | 0.5 Torr (13.56 MHz) |
| substrate temperature | 200° C. |
| layer thickness | 0.3 μm (3000 Å) |

TABLE 12

| | |
|---|---|
| C$_2$F$_6$ | 300 sccm |
| substrate temperature | 200° C. |
| inner pressure | 5 mTorr |
| power | 500 W (60 MHz) |

TABLE 13 charge transportation layer

| | |
|---|---|
| SiH$_4$ | 500 sccm |
| H$_2$ | 500 sccm |
| CH$_4$ | 50 sccm |
| power | 300 W (2.45 GHz) |
| inner pressure | 15 mTorr |
| substrate temperature | 200° C. |
| layer thickness | 15 μm | charge generation layer

| | |
|---|---|
| SiH$_4$ | 500 sccm |
| H$_2$ | 500 sccm |
| power | 300 W (2.45 GHz) |
| inner pressure | 15 mTorr |
| substrate temperature | 200° C. |
| layer thickness | 5 μm | surface protective layer

| | |
|---|---|
| CH$_4$ | 100 sccm |
| power | 1000 W (2.45 GHz) |
| inner pressure | 10 mTorr |
| substrate temperature | 200° C. |
| layer thickness | 0.5 μm (5000 Å) |

TABLE 14

| | Example 4 | | | | Comparative Example 5 | Comparative Example 6 | Comparative Example 7 |
|---|---|---|---|---|---|---|---|
| | 50 MHz | 105 MHz | 300 MHz | 450 MHz | 13.55 MHz | 500 MHz | 2.45 GHz |
| charge retentivity | ◉ | ◉ | ◉ | ○ | Δ | Δ | Δ |
| performance of charge retentivity against temperature change | ◉ | ◉ | ◉ | ○ | Δ | Δ | Δ |
| photosensitivity | ○ | ○ | ○ | ○ | Δ | Δ | Δ |
| residual potential | ○ | ○ | ○ | ○ | ○ | ○ | ○ |
| water repellency (before durability test) | ◉ | ◉ | ◉ | ○ | ○ | ○ | ○ |
| water repellency (after durability test) | ◉ | ◉ | ◉ | ○ | × | Δ | Δ |
| occurrence of smeared image | ◉ | ◉ | ◉ | ○ | × | × | × |
| halftone reproduction | ◉ | ◉ | ◉ | ◉ | ◉ | ◉ | ◉ |

TABLE 15 lower blocking layer

| | |
|---|---|
| SiH$_4$ | 100 sccm |
| H$_2$ | 500 sccm |
| NO | 5 sccm |
| B$_2$H$_6$ | 1500 ppm |
| power | 200 W (13.56 MHz) |
| inner pressure | 0.5 Torr |
| substrate temperature | 250° C. |
| layer thickness | 2 μm | photoconductive layer

| | |
|---|---|
| SiH$_4$ | 400 sccm |
| H$_2$ | 500 sccm |
| power | 800 W (13.56 MHz) |
| inner pressure | 0.5 Torr |
| substrate temperature | 250° C. |
| layer thickness | 30 μm | surface protective layer

| | |
|---|---|
| CH$_4$ | 500 sccm |
| power | 1500 W (105 MHz) |
| inner pressure | (changed) |
| substrate temperature | 250° C. |
| layer thickness | 0.6 μm (6000 Å) |

TABLE 16

| | |
|---|---|
| CF$_4$ | 200 sccm |
| substrate temperature | 30° C. |
| inner pressure | 45 mTorr |
| power | 500 W (105 MHz) |

TABLE 17

| | Example 5 | | | | | | |
|---|---|---|---|---|---|---|---|
| inner pressure (mTorr) | 1 | 5 | 10 | 30 | 50 | 70 | 100 |
| charge retentivity | ◉ | ◉ | ◉ | ◉ | ◉ | ○ | ○ |
| performance of charge retentivity against temperature change | ◉ | ◉ | ◉ | ◉ | ◉ | ○ | ○ |
| photosensitivity | ○ | ○ | ○ | ○ | Δ | Δ | Δ |
| residual potential | ○ | ○ | ○ | ○ | ○ | ○ | ○ |
| water repellency (before durability test) | ◉ | ◉ | ◉ | ◉ | ◉ | ○ | ○ |
| water repellency (after durability test) | ◉ | ◉ | ◉ | ◉ | ◉ | ○ | ○ |
| occurrence of smeared image | ◉ | ◉ | ◉ | ◉ | ◉ | ○ | ○ |
| halftone reproduction | ◉ | ◉ | ◉ | ◉ | ◉ | ◉ | ◉ |

TABLE 18 lower blocking layer

| | |
|---|---|
| SiH$_4$ | 300 sccm |
| H$_2$ | 500 sccm |

TABLE 18-continued

| | |
|---|---|
| NO | 8 sccm |
| $B_2H_6$ | 2000 ppm |
| power | 100 W (13.56 MHz) |
| inner pressure | 0.4 Torr |
| substrate temperature | 200° C. |
| layer thickness | 1 μm |
| photoconductive layer | |
| $SiH_4$ | 500 sccm |
| $H_2$ | 500 sccm |
| power | 400 W (13.56 MHz) |
| inner pressure | 0.5 Torr |
| substrate temperature | 200° C. |
| layer thickness | 20 μm |
| surface protective layer | |
| $CH_4$ | 500 sccm |
| power | 800 W (80 MHz) |
| inner pressure | 20 mTorr |
| substrate temperature | 250° C. |
| layer thickness | 0.01~1.5 μm (100 Å~15000 Å) |

TABLE 19

| | |
|---|---|
| $CF_4$ | 400 sccm |
| substrate temperature | 200° C. |
| inner pressure | 100 mTorr |
| power | 200 W (80 MHz) |

TABLE 20

| | Example 6 | | | | | Comparative Example 8 | |
|---|---|---|---|---|---|---|---|
| thickness of surface protective | 100 | 1000 | 3000 | 5000 | 10000 | 50 | 11000 |
| charge retentivity | ○ | ○ | ⊙ | ⊙ | ⊙ | Δ | ○ |
| performance of charge retentivity against temperature change | ○ | ○ | ⊙ | ⊙ | ⊙ | Δ | ○ |
| photosensitivity | ○ | ○ | ○ | ○ | Δ | ○ | × |
| residual potential | ○ | ○ | ○ | ○ | ○ | ○ | Δ |
| water repellency (before durability test) | ⊙ | ⊙ | ⊙ | ⊙ | ⊙ | ○ | ○ |
| water repellency (after durability test) | ⊙ | ⊙ | ⊙ | ⊙ | ⊙ | ○ | ○ |
| occurrence of smeared image | ⊙ | ⊙ | ⊙ | ⊙ | ⊙ | ○ | ○ |
| halftone reproduction | ⊙ | ⊙ | ⊙ | ⊙ | ⊙ | ⊙ | ⊙ |

What is claimed is:

1. A light receiving member comprising an electrically conductive substrate, a photoconductive layer comprising a non-single crystalline material containing at least silicon atoms as a matrix formed on said substrate by decomposing a silicon-containing raw material gas, and a surface protective layer comprising a non-single crystalline carbon material containing hydrogen atoms formed on said photoconductive layer by decomposing a raw material gas comprising at least a hydrocarbon using a high frequency power with an oscillation frequency of 50 MHz to 450 MHz, wherein said surface protective layer has a thickness of 100 to 10,000 Å and an etched surface, said etched surface covered by fluorine atoms, wherein said etched surface covered by fluorine atoms being formed by etching a 20 Å or more thick surface side layer region of said surface protective layer comprising said non-single crystalline carbon material at an etching speed of 0.1 to 50 Å/sec. in an atmosphere containing a fluorine-containing plasma produced by decomposing a fluorine-containing gas using a high frequency power with an oscillation frequency of 50 MHz to 450 MHz.

2. A light receiving member according to claim 1, wherein the non-single crystalline carbon material is formed at an inner pressure of 100 mTorr or less.

3. A light receiving member according to claim 1, wherein the high frequency power upon forming the non-single crystalline carbon material has a wattage of 1 W/cc or more for the raw material gas.

4. A light receiving member according to claim 1, wherein the thickness of the surface side layer region to be etched is more than 100 Å.

5. A light receiving member according to claim 1, wherein the photoconductive layer has a thickness of 1 μm to 50 μm.

6. A light receiving member according to claim 1, wherein the fluorine-containing gas contains a compound selected from $CF_4$, $CHF_3$, $C_2F_6$, $CHClF_2$, $F_2$, $C_3F_8$, and $C_4F_{10}$.

7. A light receiving member according to claim 1, wherein the hydrocarbon includes $CH_4$.

8. A light receiving member according to claim 1, wherein the non-single crystalline carbon material contains an amorphous material.

9. A light receiving member according to claim 1, wherein the photoconductive layer comprises a charge generation layer and a charge transportation layer.

10. A light receiving member according to claim 1, wherein the photoconductive layer includes a blocking layer.

11. A light receiving member according to claim 10, wherein the blocking layer is positioned on the substrate side.

12. A light receiving member according to claim 1 which is used in electrophotography.

13. A process for producing a light receiving member, comprising the steps of:

(a) placing an electrically conductive substrate in a deposition chamber capable of retaining a vacuum and which is provided with an exhaust means and a means for introducing a raw material gas thereinto, (b) forming a photoconductive layer comprising a non-single crystalline material containing at least silicon atoms as a matrix on said substrate by decomposing a silicon-containing raw material gas, (c) forming a layer comprising a non-single crystalline carbon material containing hydrogen atoms on said photoconductive layer by decomposing a raw material gas comprising at least a hydrocarbon using a high frequency power with an oscillation frequency of 50 MHz to 450 MHz, and d) etching a 20 Å or more thick surface side layer region of said layer at an etching speed of 0.1 to 50 Å/sec. in an atmosphere composed of a fluorine-containing plasma produced by decomposing a fluorine-containing gas using a high frequency power with an oscillation frequency of 50 MHz to 450 MHz thereby forming on said photoconductive layer a 100 to 10,000 Å thick surface protective layer having an outer surface of fluorine atoms.

14. The process according to claim 13, wherein the formation of the surface protective layer in the step (c) is conducted at an inner pressure of 100 mTorr or less.

15. The process according to claim 13, wherein the high frequency power used in the formation of the surface protective layer in the the step (c) has a wattage of 1 W/cc or more for the raw material gas.

16. The process according to claim 13, wherein the thickness of the surface side layer region to be etched in the step (d) is more than 100 Å.

17. The process according to claim 13, wherein the photoconductive layer has a thickness of 1 μm to 50 μm.

18. The process according to claim 13, wherein the fluorine-containing gas used in the step (d) contains a compound selected from $CF_4$, $CHF_3$, $C_2F_6$, $ClF_3$, $CHClF_2$, $F_2$, $C_3F_8$, and $C_4F_{10}$.

19. The process according to claim 13, wherein the hydrocarbon in the step (c) includes $CH_4$.

20. A light receiving member having a surface protective layer constituted by a non-single crystalline carbon material and which has a surface etched in a fluorine-containing gaseous atmosphere by applying a high frequency power with an oscillation frequency of 50 MHz to 450 MHz.

21. A light receiving member according to claim 20 which is used in electrophotography.

22. A process for producing a surface protective layer of a light receiving member comprising etching a surface of a non-single crystalline carbon material in a fluorine-containing gaseous atmosphere by applying a high frequency power with an oscillation frequency of 50 MHz to 450 MHz.

23. A light receiving member according to claim 20, wherein the fluorine-containing gaseous atmosphere is a fluorine-containing plasma atmosphere.

24. A light receiving member according to claim 20, wherein the surface protective layer has a thickness of 100 to 10,000 Å.

25. A light receiving member according to claim 20, wherein the surface protective layer has a surface provided with fluorine atoms.

26. A light receiving member according to claim 20, wherein the surface protective layer has an etched surface formed by etching a 20 Å or more thick surface side region of the non-single crystalline material as the surface protective layer.

27. A light receiving member according to claim 26, wherein the etching is conducted at an etching speed of 1 to 50 Å/sec.

28. A light receiving member according to claim 20, wherein the surface protective layer is provided on a photoconductive layer.

29. A light receiving member according to claim 28, wherein the photoconductive layer comprises a silicon-containing non-single crystalline material.

30. A process for producing a surface protective layer according to claim 22, wherein the fluorine-containing gaseous atmosphere is a fluorine-containing plasma atmosphere.

31. A process for producing a surface protective layer according to claim 22, wherein a front surface region of the non-single crystalline carbon material is etched so that the non-single crystalline carbon material has a thickness of 100 to 10,000 Å.

32. A process for producing a surface protective layer according to claim 22, wherein the etched surface of the non-single crystalline carbon material is provided with fluorine atoms.

33. A process for producing a surface protective layer according to claim 22, wherein a 20 Å or more thick front surface region of the non-single crystalline carbon material is etched.

34. A process for producing a surface protective layer according to claim 33, wherein the etching of the 20 Å or more thick front surface region of the non-single crystalline carbon material is conducted at an etching speed of 1 to 50 Å/sec.

35. A process for producing a surface protective layer according to claim 22, which further comprises the steps of forming a photoconductive layer and forming thereon a layer of a non-single crystalline carbon material, prior to the step of forming the surface protective layer.

36. A process for producing a surface protective layer according to claim 35, wherein the photoconductive layer comprises a silicon-containing non-single crystalline material.

* * * * *

UNITED STATES PATENT AND TRADEMARK OFFICE
CERTIFICATE OF CORRECTION

PATENT NO. : 5,849,446

DATED : December 15, 1998

INVENTOR(S) : JUNICHIRO HASHIZUME ET AL.

It is certified that error appears in the above-identified patent and that said Letters Patent is hereby corrected as shown below:

On the title page, Item
[57] ABSTRACT

Line 1, "a" should read --an--.
Line 19, "surface. And" should read --surface, and--.

COLUMN 1

Line 36, "manners" should read --methods--.

COLUMN 2

Line 1, "constitutes" should read --constituted by--.
Line 32, "pollution" should read --pollution.--.
Line 47, "100um" should read --100$\mu$m--.

COLUMN 3

Line 45, "2,000 UA." should read --2,000$\mu$A.--.

COLUMN 5

Line 61, "a electrically" should read --an electrically--.

UNITED STATES PATENT AND TRADEMARK OFFICE
CERTIFICATE OF CORRECTION

PATENT NO. : 5,849,446

DATED : December 15, 1998

INVENTOR(S) : JUNICHIRO HASHIZUME ET AL.

It is certified that error appears in the above-identified patent and that said Letters Patent is hereby corrected as shown below:

COLUMN 9

Line 25, "out" should be deleted.

COLUMN 10

Line 19, "having" should read --having been--.
   Line 32, "entire" should read ---entirety---.
   Line 49, "there can" should read --can there--.

COLUMN 11

Line 11, "changes," should read --changes--.
   Line 28, "occurred" should read --occurring--.
   Line 67, "a" should read --an--.

COLUMN 13

Line 40, "cover" should read --to cover--; and "entire" should read --entirety--.

UNITED STATES PATENT AND TRADEMARK OFFICE
CERTIFICATE OF CORRECTION

PATENT NO. : 5,849,446

DATED : December 15, 1998

INVENTOR(S) : JUNICHIRO HASHIZUME ET AL.

Page 3 of 8

It is certified that error appears in the above-identified patent and that said Letters Patent is hereby corrected as shown below:

COLUMN 14

Line 14, "a a" should read --a--.
    Line 16, "increased to" should read --increased, and--.
    Line 17, "not" should read --does not--.
    Line 25, "an" should read --a--.
    Line 43, "entire" should read --entirety--.

COLUMN 15

Line 1, "that" should read --that it--.
    Line 8, "hydrocarbon" should read --hydrocarbons--.
    Line 35, "to produce." should read --to be produced.--.

COLUMN 16

Line 32, "to etch" should read --etching--.
    Line 38, "easy" should read --ease--.

COLUMN 18

Line 52, "to cool" should read --cooling--.

UNITED STATES PATENT AND TRADEMARK OFFICE
CERTIFICATE OF CORRECTION

PATENT NO. : 5,849,446

DATED : December 15, 1998

INVENTOR(S) : JUNICHIRO HASHIZUME ET AL.

Page 4 of 8

It is certified that error appears in the above-identified patent and that said Letters Patent is hereby corrected as shown below:

COLUMN 20

Line 7, "therminated" should read --terminated--.

COLUMN 21

Line 40, "ratatable" should read --rotatable--.
   Line 43, "indicated" should read --indicates--.

COLUMN 26

Line 27, "of" should read --for--.
   Line 55, "of" should read --for--.

COLUMN 27

Line 9, "member." should read --members.--.
   Line 31, "member." should read --members.--.
   Line 43, "0.3um" should read --0.3µm--.
   Line 48, "member." should read --members.--.

UNITED STATES PATENT AND TRADEMARK OFFICE
CERTIFICATE OF CORRECTION

PATENT NO. : 5,849,446

DATED : December 15, 1998

INVENTOR(S) : JUNICHIRO HASHIZUME ET AL.

It is certified that error appears in the above-identified patent and that said Letters Patent is hereby corrected as shown below:

COLUMN 28

Line 56, "0.3um" should read --0.3$\mu$m--.

COLUMN 30

Line 3, "respectively" should read --respectively,--.
   Line 60, "were" should be deleted.

COLUMN 32

Line 46, "an" should read --a--.
   Line 58, "occurence" should read --occurrence--.

COLUMN 34

Line 44, "open" should read --opened--.
   Line 63, "proved" should read --provided--.

COLUMN 35

Line 29, "members," should read --member,--.

UNITED STATES PATENT AND TRADEMARK OFFICE
CERTIFICATE OF CORRECTION

PATENT NO.   : 5,849,446

DATED        : December 15, 1998

INVENTOR(S) : JUNICHIRO HASHIZUME ET AL.

It is certified that error appears in the above-identified patent and that said Letters Patent is hereby corrected as shown below:

COLUMN 36

Line 47, "a" should read --an--.

COLUMN 37

Line 53, "wit" should read --with--.

COLUMN 39

Line 19, "member" should read --members--.
   Line 37, "was" should be deleted.
   Line 41, "occurred" should read --occurring--.
   Line 59, "eletropho-" should read -- electropho- --.

COLUMN 40

Line 8, "are" should be deleted.
   Line 16, "are" should be deleted.

UNITED STATES PATENT AND TRADEMARK OFFICE
CERTIFICATE OF CORRECTION

PATENT NO. : 5,849,446

DATED : December 15, 1998

INVENTOR(S) : JUNICHIRO HASHIZUME ET AL.

It is certified that error appears in the above-identified patent and that said Letters Patent is hereby corrected as shown below:

COLUMN 41

Table 1, "substate" should read --substrate--.
    Table 1, "photocunductive" should read
      --photoconductive--.
    Table 1, "substate" should read --substrate--.
    Table 1, "substate" should read --substrate--.
    Table 3, "photocunductive" should read
      --photoconductive--.

COLUMN 42

Table 5, "photocunductive" should read
      --photoconductive--.

COLUMN 43

Table 10, "$C_3F_6$" should read --$C_3F_8$--.

UNITED STATES PATENT AND TRADEMARK OFFICE
CERTIFICATE OF CORRECTION

PATENT NO. : 5,849,446

DATED : December 15, 1998

INVENTOR(S) : JUNICHIRO HASHIZUME ET AL.

It is certified that error appears in the above-identified patent and that said Letters Patent is hereby corrected as shown below:

COLUMN 47

Table 18, "250°C." should read --200°C.--.

COLUMN 48

Line 16, "$C_2F_6$," should read --$C_2F_6$, $ClF_3$,--.

COLUMN 49

Line 13, "the the" should read --the--.

Signed and Sealed this

Nineteenth Day of September, 2000

Attest:

Q. TODD DICKINSON

*Attesting Officer*        *Director of Patents and Trademarks*